(12) United States Patent
Uemori et al.

(10) Patent No.: US 7,242,337 B2
(45) Date of Patent: Jul. 10, 2007

(54) BAND-PASS Δ-Σ AD MODULATOR FOR AD-CONVERTING HIGH FREQUENCY NARROW-BAND SIGNAL WITH HIGHER PRECISION AND LOWER POWER CONSUMPTION

(75) Inventors: Masafumi Uemori, Saitama (JP); Haruo Kobayashi, Gunma (JP); Tomonari Ichikawa, Gunma (JP); Koichiro Mashiko, Hyogo (JP)

(73) Assignee: Semiconductor Technology Academic Research Center, Yokoshama-shi (JP)

( * ) Notice: Subject to any disclaimer, the term of this patent is extended or adjusted under 35 U.S.C. 154(b) by 0 days.

(21) Appl. No.: 11/408,951

(22) Filed: Apr. 24, 2006

(65) Prior Publication Data

US 2007/0018867 A1    Jan. 25, 2007

(30) Foreign Application Priority Data

Jul. 22, 2005   (JP) ............................ P2005-213039

(51) Int. Cl.
*H03M 3/00* (2006.01)

(52) U.S. Cl. ....................... 341/143; 329/306

(58) Field of Classification Search ................ 341/144, 341/143, 155; 330/10; 375/306, 344, 324; 348/723; 329/306
See application file for complete search history.

(56) References Cited

U.S. PATENT DOCUMENTS 4,736,392 A * 4/1988 Kammeyer et al. ......... 375/324
5,473,280 A * 12/1995 Ohnishi et al. ............. 329/304
6,232,901 B1 * 5/2001 Abbey ........................ 341/143
6,232,902 B1    5/2001 Wada
6,304,301 B1 * 10/2001 Goeckler .................... 348/723

(Continued)

FOREIGN PATENT DOCUMENTS

JP    2000-244323 A    9/2000

(Continued)

OTHER PUBLICATIONS

Norman, "A Band-Pass Delta Sigma Modulator For Ultrasound Imaging at 160MHZ Clock Rate", IEEE Journal Of Solid-State Circuits, vol. 31, No. 12, Dec. 1996.*

(Continued)

*Primary Examiner*—Jean Bruner Jeanglaude
(74) *Attorney, Agent, or Firm*—Birch, Stewart, Kolasch & Birch, LLP

(57) ABSTRACT

A continuous-time band-pass ΔΣ AD modulator subtracts an analog signal from a DA converter from an inputted analog signal, outputs an analog signal having a subtraction result to an AD converter via a continuous-time analog band-pass filter, outputs a digital signal from the AD converter to the DA converter, and outputs the same digital signal as a digital signal subjected to a band-pass ΔΣ AD modulation processing. The highest input frequency "fin" of the inputted analog signal is substantially set to three-fourths of a sampling frequency "fs". The DA converter is configured to convert the inputted digital signal into the analog signal, and outputs the analog signal, which is inverted or not in response to a value of the inputted digital signal and has an amplitude of substantially zero and a gradient of substantially zero at a timing $k/(2fs)$.

20 Claims, 24 Drawing Sheets

U.S. PATENT DOCUMENTS

| | | | |
|---|---|---|---|
| 6,373,418 B1* | 4/2002 | Abbey | 341/143 |
| 6,714,608 B1* | 3/2004 | Samueli et al. | 375/344 |
| 6,724,246 B2* | 4/2004 | Oberschmidt et al. | 329/306 |
| 2001/0040930 A1* | 11/2001 | Abbey | 375/316 |
| 2002/0097085 A1* | 7/2002 | Stapleton | 330/10 |

FOREIGN PATENT DOCUMENTS

JP     2002-100992 A     4/2002

OTHER PUBLICATIONS

Munoz et al., IEEE International Solid-State Circuits Conference A 4.7mW 89 5dB DR CT Complex ΔΣ ADC with Built-in LPF, ISSCC Digest of Technical Ppers Vo. 47, pp. 500-501 (Feb. 2005).

Schreier et al., "Quadrature Mismatch-shaping" Proceedings of ISCAS, vol. 4, pp. 675-678 (May 2002).

Salo et al., IEEE International Solid-State Circuits Conference, vol. 45, pp. 218-219 (Feb. 2002).

Koc et al., Direct RF Sampling Continuous-Time Bandpas Δ-Σ A/D Converter Design for 3G Wireless Applications pp. 1-409-1-412, (May 2004).

Fontaine et al., Ieee International Solid-State Circuits Conference vol. 47, pp. 498-499,(Feb. 2004).

San et al., IECE Trans. Fundamentals, vol. E87-A, No. 4, pp. 792-800, (Apr. 2004).

Northsworthy et al., "Delta=Sigma Data Converters, -Theory, Design and simulation", IEEE Press, pp. 244-245 (1997), month unknown.

Luschas et al, IEEE Journal of Solid-State Circuits, vol. 39, No. 9, pp. 1462-1467 (Sep. 2004).

Kobayashi et al., IEICE Trans. Fundamentals, vol. E85-A, No. 2 pp. 335-346, (Feb. 2002).

* cited by examiner

Fig. 12A   WHEN DIGITAL INPUT SIGNAL IS "1"
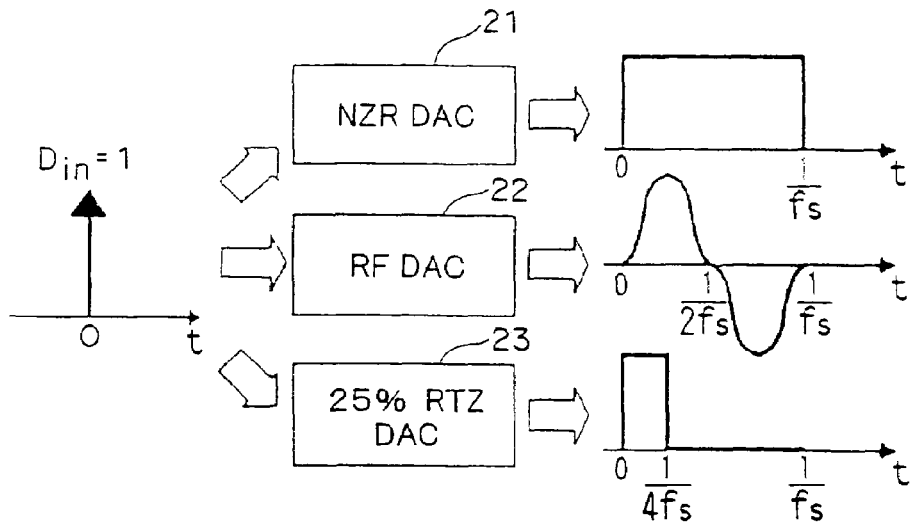
Fig. 12B   WHEN DIGITAL INPUT SIGNAL IS "0"
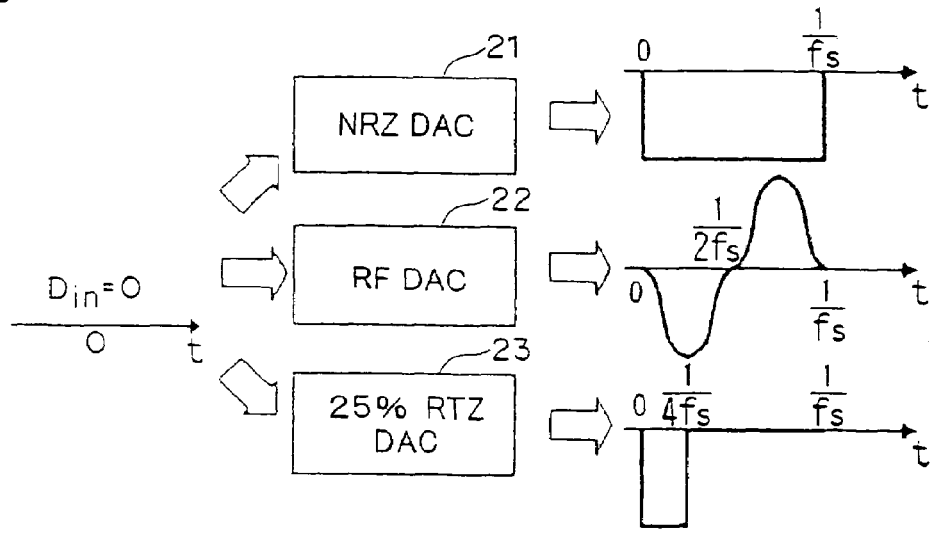

Fig. 15 DIFFERENTIAL 1-BIT RFDAC 14A

SEGMENT TYPE 3-BIT RFDAC 14B

SEGMENT TYPE 3-BIT RFDAC 14B

BAND-PASS Δ-Σ AD MODULATOR FOR AD-CONVERTING HIGH FREQUENCY NARROW-BAND SIGNAL WITH HIGHER PRECISION AND LOWER POWER CONSUMPTION

BACKGROUND OF THE INVENTION

1. Field of the Invention

The present invention relates to a band-pass ΔΣ AD modulator for AD-converting a high frequency narrow-band signal with higher precision and lower power consumption which is provided in an analog front-end of a receiver such as a radio LAN or a portable telephone, and a digital radio receiver using the same band-pass ΔΣ AD modulator.

2. Description of the Prior Art

The use of a band-pass ΔΣ AD modulator has been examined for AD-converting a high frequency narrow-band signal with higher precision and lower power consumption which is provided in an analog front-end of a receiver such as a radio LAN or a portable telephone (See first to sixth non-patent documents described later, for example).

Prior art documents related to the present invention are as follows:

(1) first patent document: Japanese patent laid-open publication No. JP-2000-244323-A;

(2) second patent document: Japanese patent laid-open publication No. JP-2002-100992-A;

(3) first non-patent document: F. Munoz et al., "A 4.7 mW 89.5 dB DR CT Complex ΔΣ ADC with Built-in LPF", ISSCC Digest of Technical Papers, Vol. 47, pp. 500–501, February 2005;

(4) second non-patent document: R. Schreier et al., "A 10–300 MHz IF-digitizing IC with 90–105-d B dynamic range and 15–333-kHz band width", IEEE Journal of Solid-State Circuits, Vol. 37 No 12, pp. 1636–1644, December 2002;

(5) third non-patent document: T. Salo et al., "A Dual-Mode 80 MHz Bandpass ΔΣ Modulator for a GSM/WCDMA IF-receiver", ISSCC Digest of Technical Papers, Vol. 45, pp. 218–219, February 2002;

(6) fourth non-patent document: U. V. Kack et al., "Direct RF Sampling continuous-Time Bandpass ΔΣ A/D Converter Design for 3G Wireless Applications", Proceedings of IEEE ISCA, pp. I-409–J-412, Vancouver, Canada, May 2004;

(7) fifth non-patent document: P. Fontaine et al., "A Low-Noise Low-Voltage CT ΔΣ Modulator with Digital Compensation of Excess Loop Delay", ISSCC Digest of Technical Papers, Vol. 47, pp. 498–499, February 2004;

(8) sixth non-patent document: H. San et al., "A noise-shaping algorithm of multi-bit DAC nonlinearities in complex bandpass ΔΣ AD modulators", IEICE Transactions on Fundamentals, Vol. E87-A, N. 4, pp. 792–800, April 2004;

(9) seventh non-patent document S. R. Norsworthy et al. (editors), "Delta-Sigma Data Converters,-Theory, Design and Simulation", IEEE Press, pp. 244–245, 1997;

(10) eighth non-patent document: S. Luschs et al., "Radio Frequency Digital-to-Analog Converter", IEEE Journal of Solid-State Circuits, Vol. 39, No. 9, pp. 1462–1467, September 2004; and

(11) ninth non-patent document: H. Kobayashi et al., "Sampling Jitter and Finite Aperture Time Effects in Wideband Data Acquisition Systems", IEICE Transactions on Fundamentals, Vol. E85-A, No. 2, pp. 335–346, February 2002.

Various kind of examinations have been made for realizing a software radio system according to a prior art having a minimum-analog and rich-digital circuit configuration, from which a frequency converter circuit for converting an RF signal into a baseband is eliminated so as to directly AD-convert the RF signal (See FIG. 1A). A digital radio receiver according to the prior art of FIG. 1A is constituted by including an antenna 1, a band-pass filter 2, a low-noise amplifier 3, a frequency converter unit 4 for converting an inputted signal into a baseband, a pair of low-pass ΔΣ AD modulators 5a and 5b, and a digital signal processor (DSP) 6. In all the drawings including FIG. 1A and being subsequent to FIG. 1A, an AD converter (analog-to-digital converter) will be abbreviated as an ADC, and a DA converter (digital-to-analog converter) will be abbreviated as a DAC.

Referring to FIG. 1A, conventionally, a configuration of a discrete-time circuit (FIG. 3) has been often used which utilizes a switched capacitor circuit capable of performing AD conversion with higher precision. However, recently, a configuration of a continuous-time circuit (FIG. 4) is studied which utilizes a continuous-time analog filter in the continuous-time circuit, because of the possibility of the operation at a higher rate and with lower power consumption. In this case, an influence of a clock jitter of the internal AD converter is relatively small because of noise-shaping, however, such a problem occurs that an influence of a jitter of an internal DA converter leads to deterioration in precision of the entire AD modulator.

SUMMARY OF THE INVENTION

An essential object of the present invention is to provide a band-pass ΔΣ AD modulator capable of solving the above-stated problems, and performing a band-pass ΔΣ AD modulation processing with a higher precision to provide a digital radio receiver having a configuration simpler than that of a digital radio receiver according to the prior art, and to provide a digital radio receiver using the same band-pass ΔΣ AD modulator.

According to the first aspect of the present invention, a band-pass ΔΣ AD modulator includes an analog band-pass filter, an AD converter for performing AD conversion using a sampling clock having a predetermined sampling frequency "fs", and a DA converter for performing DA conversion using the sampling clock having the sampling frequency "fs". The band-pass ΔΣ AD modulator subtracts an analog signal from the DA converter from an inputted analog signal, outputs an analog signal having a subtraction result to the AD converter via the analog band-pass filter, outputs a digital signal from the AD converter to the DA converter, and outputs the digital signal as a digital signal subjected to a band-pass ΔΣ AD modulation processing. In this case, the highest input frequency "fin" of the inputted analog signal is substantially set to three-fourths of the sampling frequency "fs". In addition, the DA converter converts an inputted digital signal into an analog signal, and outputs the analog signal, which is inverted or not in response to a value of the inputted digital signal and has an amplitude of substantially zero and a gradient of substantially zero at a timing k/(2fs), where "k" is any integer.

In the above-mentioned band-pass ΔΣ AD modulator, at a timing near the timing k/(2fs), the analog signal outputted from the DA converter preferably changes so as to have a smaller gradient than gradients at the other timings other than timings near the timing k/(2fs), (the other timings excluding timings corresponding to the maximum point and the minimum point of the analog signal).

In addition, in the above-mentioned band-pass ΔΣ AD modulator, the DA converter preferably generates the analog signal by switching a predetermined alternating-current signal in response to the sampling clock, based on a value of the inputted digital signal, and by applying a predetermined bias voltage to a switched signal.

Further, in the above-mentioned band-pass ΔΣ AD modulator the DA converter is preferably a multi-bit DA converter, and the AD converter is preferably a multi-bit AD converter.

Still further, in the above-mentioned band-pass ΔΣ AD modulator, the analog band-pass filter is preferably a continuous-time analog band-pass filter.

According to the second aspect of the present invention, there is provided a digital radio receiver for band-pass-filtering a received signal using a band-pass filter, and then executing a band-pass ΔΣ AD modulation processing on the band-pass-filtered signal by the above-mentioned band-pass ΔΣ AD modulator.

Therefore, each of the band-pass ΔΣ AD modulator and the digital radio receiver using the same band-pass ΔΣ AD modulator according to the present invention is configured so that the highest input frequency "fin" of the inputted analog signal is substantially set to the three-fourths of the sampling frequency "fs", and so that the DA converter converts an inputted digital signal into an analog signal and outputs the analog signal, which is inverted or not in response to a value of the inputted digital signal and has an amplitude of substantially zero and a gradient of substantially zero at a timing k/(2fs), where "k" is any integer. Accordingly, each of the band-pass ΔΣ AD modulator and the digital radio receiver using the band-pass ΔΣ AD modulator according to the present invention has a configuration simpler than that of the prior art, can perform the AD-conversion at a higher precision than that of the prior art, and can directly convert the RF signal into the digital signal. In addition, it is possible to deal with a higher frequency input signal and realize operation with power consumption lower than that of the prior art.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 12A is a diagram showing the waveforms of the output signals when a digital input signal is "1" and the digital input signal is inputted to the respective DA converters 21, 22 and 23;

FIG. 12B is a diagram showing the waveforms of the output signals when the digital input signal is "0" and the digital input signal is inputted to the respective DA converters 21, 22 and 23;

DETAILED DESCRIPTION OF THE PREFERRED EMBODIMENTS

Preferred embodiments according the present invention will be described below with reference to the drawings. In the attached drawings, the same numerical references denote components similar to each other.

Preliminary Investigations in Preferred Embodiments

Figures 1A, 1B:
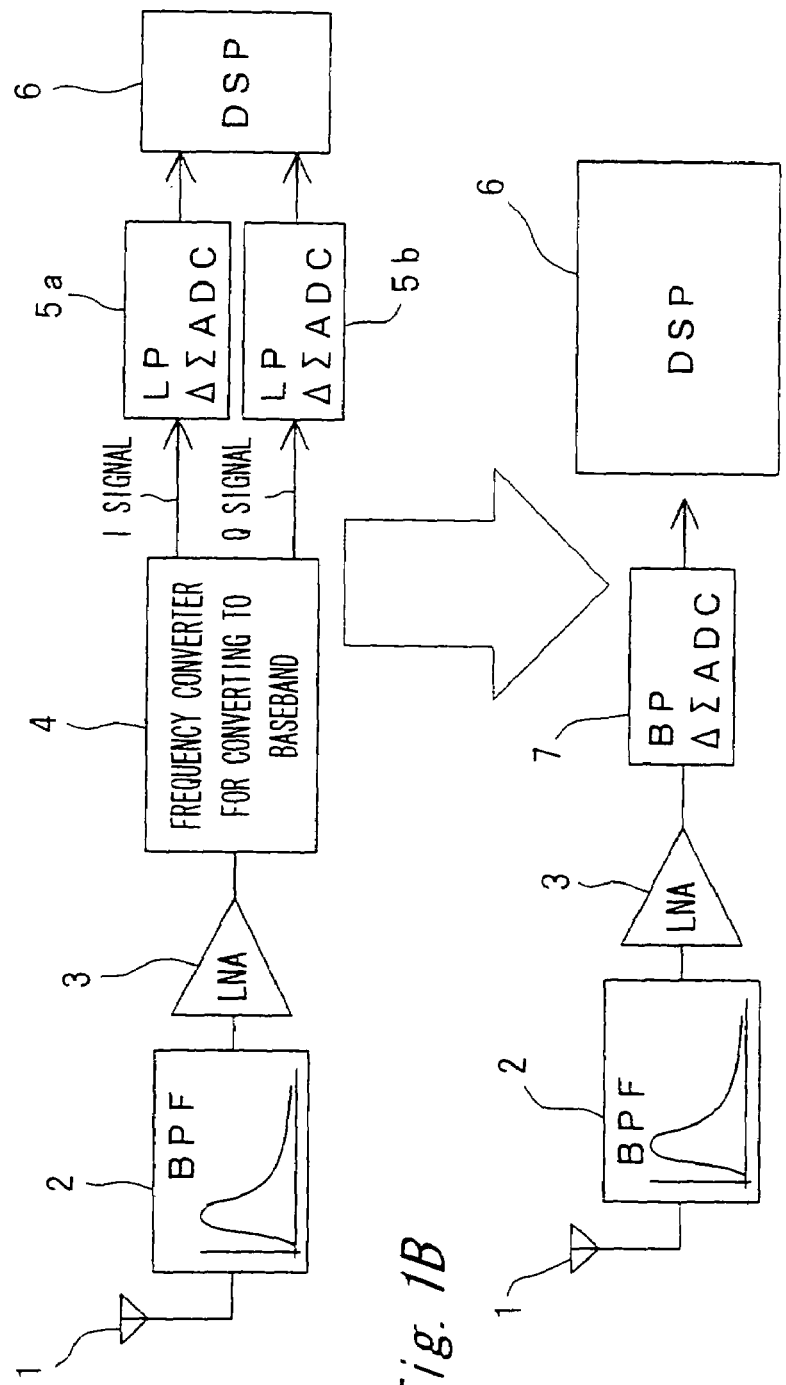
FIG. 1A is a block diagram showing a configuration of a digital radio receiver according to a prior art.
FIG. 1B is a block diagram showing a configuration of a digital radio receiver according to a basic configuration of the present invention.

The present invention proposes such a circuit configuration that a high frequency RF signal can be directly AD-converted with a relatively high precision and with relatively low power consumption, by performing subsampling with using a DA converter less influenced by a jitter as an internal DA converter of a continuous band-pass ΔΣ AD modulator. In particular, in the preferred embodiments, a configuration will be described below which can further improve the advantageous effects that the continuous-time band-pass ΔΣ AD modulator "can deal with a high frequency signal", and which solves the disadvantageous defects that the continuous-time band-pass ΔΣ AD modulator has such a problem that "the clock jitter of the DA converter has a great influence on the precision of the modulator". It is noted that the continuous-time band-pass ΔΣ AD modulator according to the present preferred embodiments can be used, for example, as a band-pass ΔΣ AD modulator 7 of a digital radio receiver of FIG. 1B. Referring to FIG. 1B, a received signal received by the antenna 1 is band-pass-filtered by a band-pass filter 2. A resultant narrow-band analog signal is then low-noise-amplified by a low-noise amplifier 3, and is inputted to the band-pass ΔΣ AD modulator 7 according to the present preferred embodiments. The band-pass ΔΣ AD modulator 7 executes a band-pass ΔΣ AD modulation processing on the inputted narrow-band analog signal, and outputs a processed digital signal to a digital signal processor 6. The digital signal processor 6 performs a processing such as a demodulation processing on the digital signal.

In each of many band-pass ΔΣ AD modulators according to the prior art, a frequency which is four times as high as a central frequency "fc" of an input signal band is used as a sampling clock frequency (referred to as a sampling frequency hereinafter) "fs" (where fs=4fc: Nyquist sampling frequency), because of such a reason that it is easy to design a digital filter provided at the subsequent stage of the modulator (See the seventh non-patent document, for example). Namely, in a configuration according to the prior art, a central frequency of an input band that can be dealt with is a quarter (fc=(¼)fs) of the clock frequency "fs", at which an internal AD converter and an internal DA converter can operate. Accordingly, when the modulator is to deal with a high frequency input signal, the clock frequency "fs" of the modulator becomes high, and the internal AD converter and the internal DA converter become unable to operate.

Figure 2:
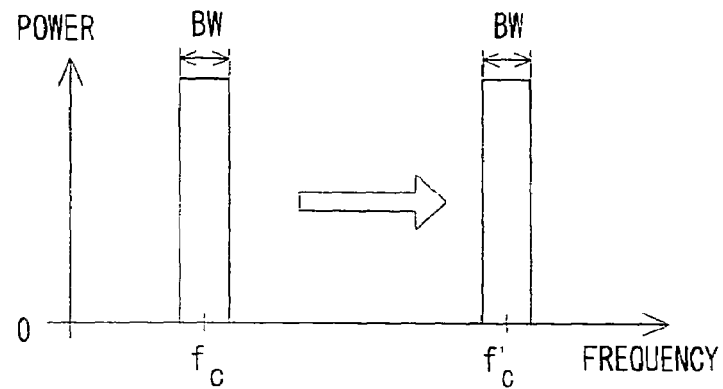
FIG. 2 is a spectral diagram showing a central frequency dealt with by a band-pass ΔΣ AD modulator according to preferred embodiments of the present invention.
Figure 3:
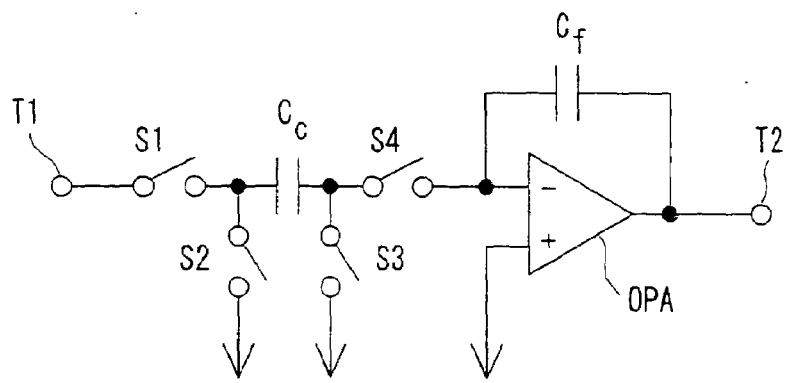
FIG. 3 is a circuit diagram showing a circuit configuration of a discrete-time filter according to the prior art.
Figure 4:
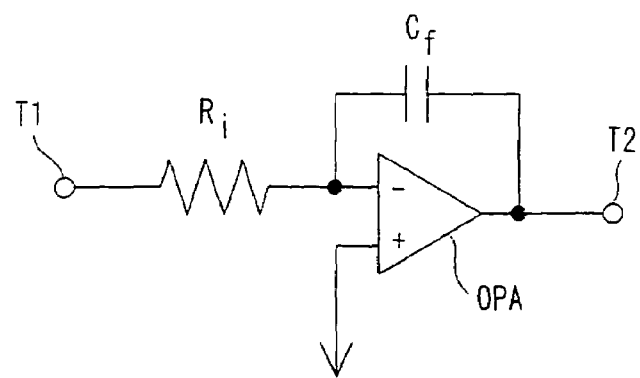
FIG. 4 is a circuit diagram showing a circuit configuration of a continuous-time filter according to the prior art.
Figure 5:
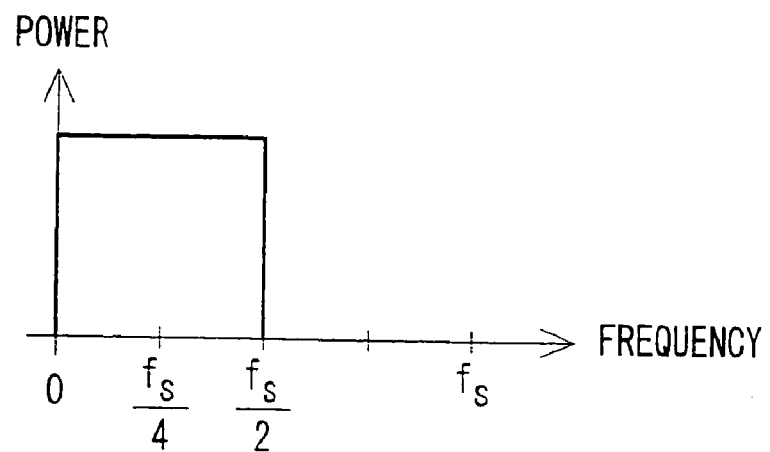
FIG. 5 is a spectral diagram showing a usage band for Nyquist sampling for use in a band-pass ΔΣ AD modulator according to the prior art.
Figure 6:
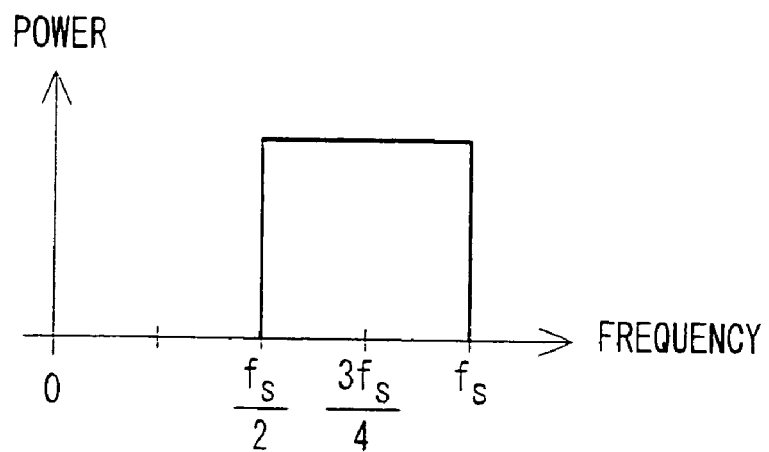
FIG. 6 is a spectral diagram showing a usage band for subsampling for use in the band-pass ΔΣ AD modulator according to the prior art.

In order to solve the above-described problems, there was proposed "an analog subsampling technique" for setting the three-fourths of the central frequency "fc" of the input signal (fc=(¾)fs) to the sampling frequency "fs". According to the technique, since the central frequency "fc" of the input band is the three-fourths of the sampling frequency "fs", the modulator can deal with a signal having a frequency which is three times as high as that of the configuration according to the prior art described above, at the same clock frequency (fc=(¾)fs). In ordinary Nyquist sampling, a band of 0≦f≦(½)fs is used as a signal band, however, in the subsampling, a band of (½)fs≦f≦fs is used as a signal band (See FIGS. 2, 5 and 6).

A band-pass modulator using a discrete-time circuit based on the above-mentioned "subsampling technique" has been already realized as an LSI and an operation of the modulator is verified. However, such an example has been hardly reported that the "subsampling technique" is applied to a band-pass modulator using a continuous-time circuit (See the fourth non-patent document, for example).

Figure 7:
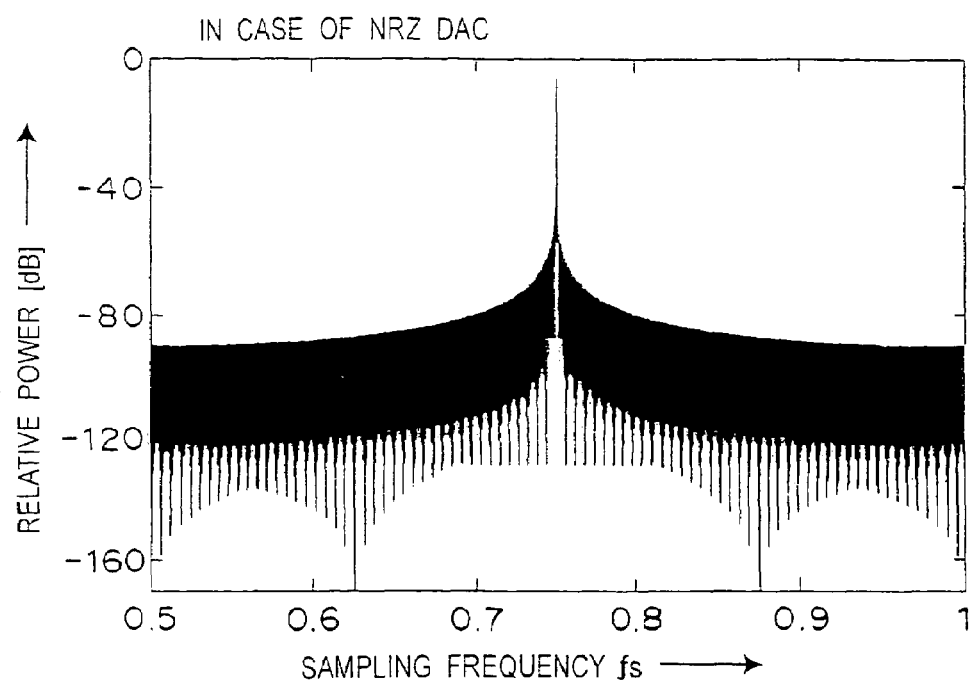
FIG. 7 is a diagram showing an output power spectrum of a continuous-time band-pass ΔΣ AD modulator when the subsampling is performed with using an NRZDA converter 21 of FIGS. 12A and 12B as an internal DA converter.
Figure 8:
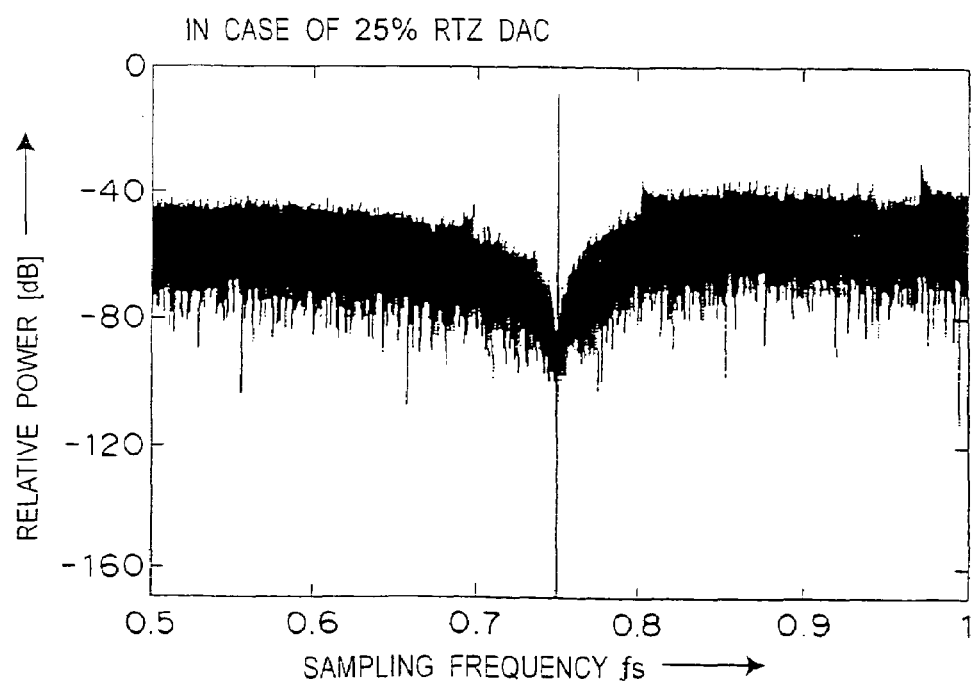
FIG. 8 is a diagram showing an output power spectrum of the continuous-time band-pass ΔΣ AD modulator when the subsampling is performed with using a 25% RTZDA converter 23 of FIGS. 12A and 12B as the internal DA converter.
Figure 9:
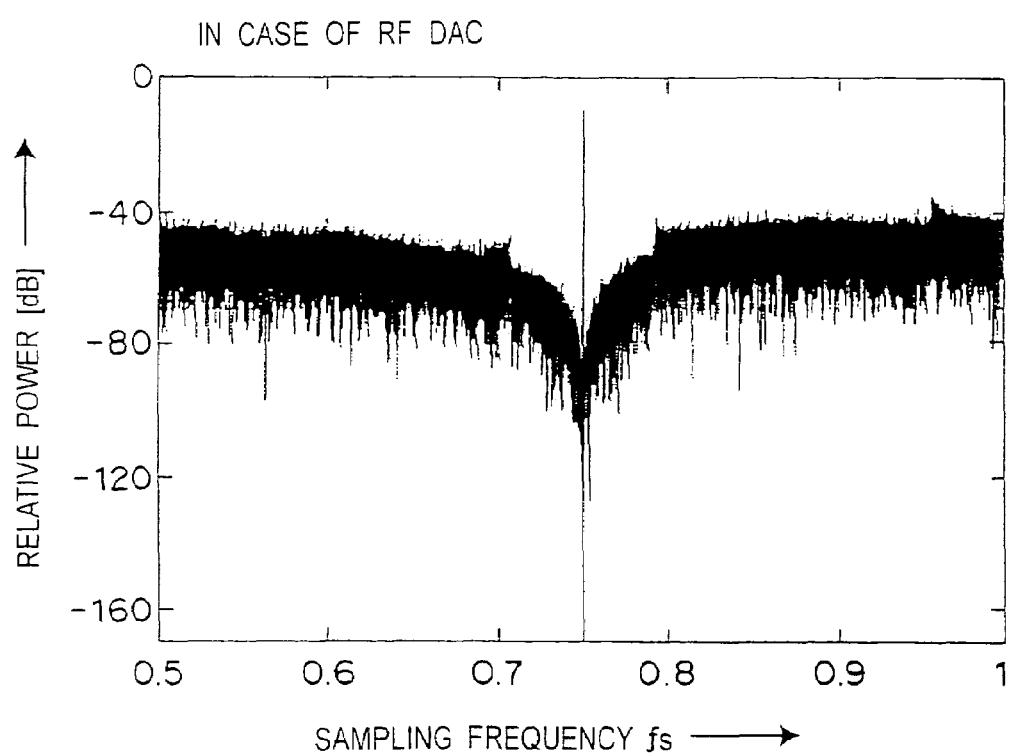
FIG. 9 is a diagram showing an output power spectrum of the continuous-time band-pass ΔΣ AD modulator when the subsampling is performed with using an RFDA converter 22 of FIGS. 12A and 12B as the internal DA converter.
Figure 10:
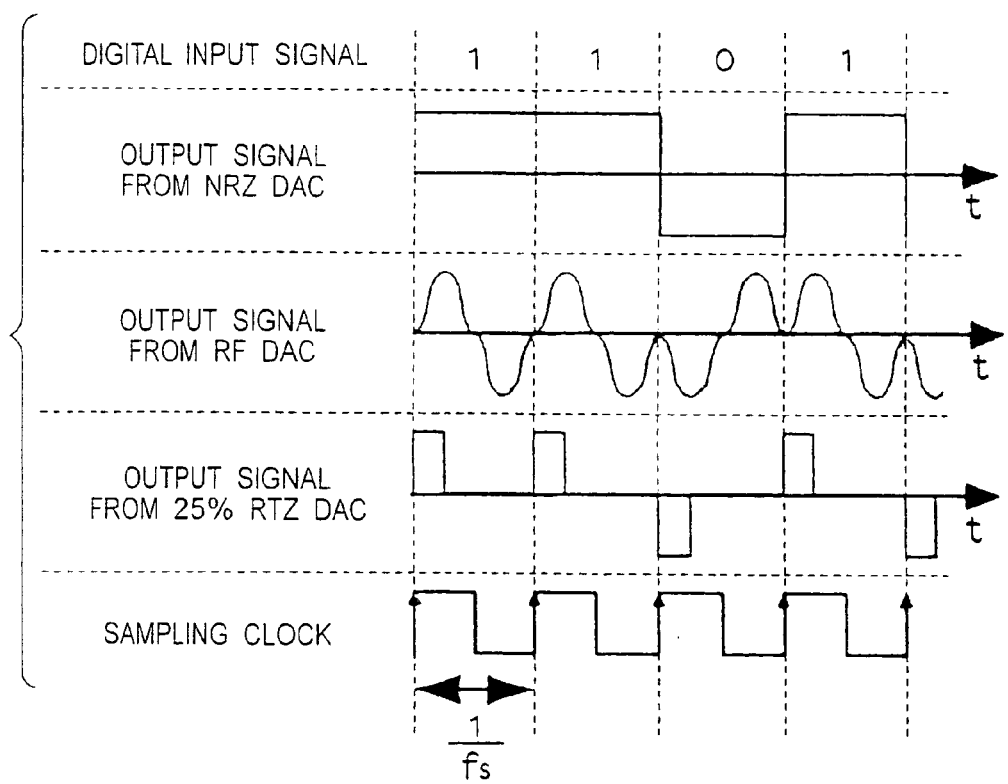
FIG. 10 is a waveform chart showing an example of waveforms of output signals from the respective DA converters 21, 22 and 23 (1-bit DA converters) of FIGS. 7 to 9.

Next, a subsampling continuous-time band-pass ΔΣ AD modulator will be examined below. FIG. 7 is a diagram showing an output power spectrum of the continuous-time band-pass ΔΣ AD modulator when the subsampling is performed with using an NRZDA converter 21 of FIGS. 12A and 12B as the internal DA converter. In addition, FIG. 8 is a diagram showing an output power spectrum of the continuous-time band-pass ΔΣ AD modulator when the subsampling is performed with using a 25% RTZDA converter 23 of FIGS. 12A and 12B as the internal DA converter. Further, FIG. 9 is a diagram showing an output power spectrum of the continuous-time band-pass ΔΣ AD modulator when the subsampling is performed with using an RFDA converter 22 of FIGS. 12A and 12B as the internal DA converter. Still further, FIG. 10 is a waveform chart showing an example of waveforms of output signals from the respective DA converters 21, 22 and 23 (1-bit DA converters) of FIGS. 7 to 9. In this case, as apparent from FIG. 10, the NRZDA converter 21 is a DA converter that outputs an NRZ (Non-Return-to-Zero) signal as an analog signal, the RFDA converter 22 is a DA converter that outputs, for example, a high frequency cosine wave signal of several time cycles for one sampling cycle as an analog signal, and the 25% RTZDA converter 23 is a DA converter that outputs an RTZ (Return-to-Zero) signal having a duty ratio or a pulse width of 25% as an analog signal.

First of all, when the NRZDA converter 21 is used as the internal DA converter, even when the subsampling is to be performed with using the zero-order hold DA converter whose output signal is the NRZ in the continuous-time band-pass modulator, the modulator does not operate as a band-pass modulator. This is confirmed by the inventors of the present invention using a MATLAB (registered trademark) simulation apparatus (See FIG. 7). As apparent from FIG. 7, when the NRZDA converter 21 is used as the internal DA converter, any noise shaping is not performed at frequencies near the frequency $(3/4)fs$. Even when the amplitude of the input signal and filter coefficients are changed, an oscillation occurs and the modulator cannot operate. This is because an impulse response of the zero-order hold DA converter becomes the maximum DC (Direct Current) gain and shows a great deterioration on a component at the frequency $(3/4)fs$. In the simulations of FIGS. 7 to 9, a first-order continuous-time band-pass filter is used as a loop filter of the continuous-time $\Delta\Sigma$ AD modulator.

Next, such a case will be described below where the RTZDA converter 23 is used as the internal DA converter. In 2004, Lucent Technologies proposed a method of performing the subsampling with using an internal DA converter that outputs the RTZ signal in the continuous-time band-pass modulator (See the fourth non-patent document, for example). In the MATLAB (registered trademark) simulation, when the RTZDA converter having a pulse width of 25% is used as the internal DA converter, the quantization noise is shaped at frequencies near the frequency $(3/4)fs$ as shown in FIG. 8. However, with this method, the jitter of the sampling clock inputted to the RTZDA converter 23 that outputs the RTZ signal greatly deteriorates the precision of the entire AD modulator. Namely, when the output signal of the DA converter is set to the RTZ signal, the influence of the clock jitter on the precision of the AD modulator with the RTZDA converter 23 is larger than that with the NRTZA converter (See FIG. 10), since the RTZ signal has two edges for one sampling cycle.

Further, such a case will be described below where the RFDA converter 22 is used as the internal DA converter. In 2004, Massachusetts Institute of Technology (MIT) proposed the RFDA converter 22 for generating a high frequency narrow-band signal (See the eighth non-patent document, for example). An ordinary DA converter is a zero-order hold DA converter whose output signal is the constant for one sampling cycle, however, the RFDA converter 22 generates a cosine wave signal having several time cycles in one sampling cycle as an output signal of the DA converter. The frequency characteristics of the impulse response of the zero-order hold DA converter have the maximum DC (Direct Current) gain. However, some of the RFDA converters 22 can obtain the maximum gain at the frequency $(3/4)fc$ without any Direct Current (DC) component. By using the RFDA converters 22, it is possible to perform the subsampling. The inventors of the present invention confirmed in the MATLAB (registered trademark) simulations that the quantization noise is shaped at the frequencies near the frequency $(3/4)fs$ (See FIG. 9). In addition, in the ordinary DA converter, a data value changes discontinuously at sampling timings. On the other hand, the RFDA converter 22 outputs the output signal of the continuous cosine wave signal, and a slew rate of the output signal is zero (dDACout/dt=0) at the sampling timing. Therefore, the influence of the sampling clock jitter on the precision of the entire modulator is extremely small. It is noted that the eighth non-patent document describes that the RFDA converter 22 is used solely as a DA converter, and does not describe that the RFDA converter 22 is used for the $\Delta\Sigma$ AD modulator.

First Preferred Embodiment

Figure 11:
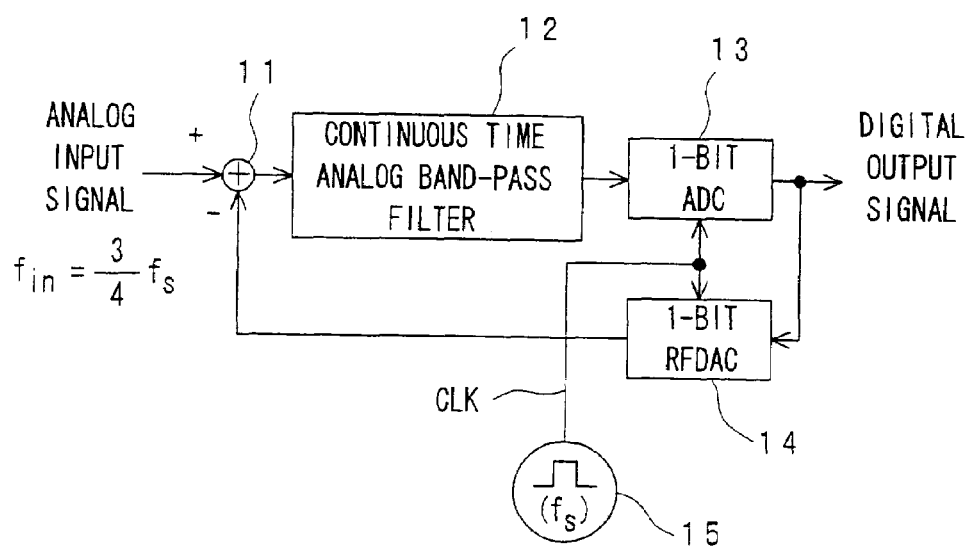
FIG. 11 is a block diagram showing a configuration of a continuous-time band-pass ΔΣ AD modulator according to a first preferred embodiment of the present invention.

Paying attention to the above-stated investigations, the inventors of the present invention proposes to use the above-mentioned RFDA converter 22 for the continuous-time band-pass $\Delta\Sigma$ AD modulator for performing the subsampling. FIG. 11 is a block diagram showing a configuration of the continuous-time band-pass $\Delta\Sigma$ AD modulator according to a first preferred embodiment of the present invention.

Referring to FIG. 11, the continuous-time band-pass $\Delta\Sigma$ AD modulator according to the present preferred embodiment is constituted by including a subtracter 11, a continuous-time analog band-pass filter 12, a 1-bit AD converter 13, a 1-bit RFDA converter 14, and a sampling clock generator 15. In this case, the sampling clock generator 15 generates a sampling clock CLK having the sampling frequency "fs", and supplies the sampling clock CLK to the 1-bit AD converter 13 and the 1-bit RFDA converter 14. An analog input signal having the highest input frequency "fin" of $(3/4)fs$ (fin=$(3/4)fs$) is inputted to the subtracter 11. The subtracter 11 subtracts an analog signal from the 1-bit RFDA converter from the inputted analog input signal, and outputs an analog signal having the subtraction result to the continuous-time analog band-pass filter 12. Next, the continuous-time analog band-pass filter 12 performs an analog-band-pass-filtering processing on the inputted analog signal at continuous time, and outputs the processed analog signal to the 1-bit AD converter 13. The 1-bit AD converter 13 converts the inputted analog signal into a 1-bit digital signal, outputs the resultant 1-bit digital signal as a digital output signal, and outputs the same signal to the 1-bit RFDA converter 14. The 1-bit RFDA converter 14 converts the inputted 1-bit digital signal into an analog signal, and outputs the analog signal to the subtracter 11. By the above-described configuration, the continuous time band-pass $\Delta\Sigma$ AD modulator can be constituted.

The continuous time band-pass $\Delta\Sigma$ AD modulator of FIG. 11 according to the present preferred embodiment of the present invention exhibits the following advantageous effects by using the RFDA converter 22 as the internal DA converter:

(i) The highest input frequency can be set to the three-fourths of the clock frequency at which the internal AD converter 13 and the internal DA converter 14 can operate. Namely, the continuous time band-pass $\Delta\Sigma$ AD modulator can deal with the input frequency three times as high as that dealt with by the modulator according to the prior art; and (ii) The influence of the jitter of the sampling clock to the DA converter 14 on the deterioration in the precision of the entire AD modulator is extremely small. In addition, because of use of the continuous time $\Delta\Sigma$ AD modulator, the following advantageous effects can be exhibited as compared with the discrete-time $\Delta\Sigma$ AD modulator. Namely, the continuous time band-pass $\Delta\Sigma$ AD modulator can realize lower power consumption, can operate at a higher clock frequency, and can simplify an anti-aliasing filter provided at the previous stage of the $\Delta\Sigma$ AD modulator.

Next, the principle and operation of the RFDA converter 22 will be described below. FIG. 12A is a diagram showing waveforms of output signals when a digital input signal is "1" and the digital input signal is inputted to the respective DA converters 21, 22 and 23, and FIG. 12B is a diagram showing waveforms of output signals when the digital input signal is "0" and the digital input signal is inputted to the respective DA converters 21, 22 and 23. In addition, FIG. 10 shows an example of the waveforms of the output signals from the respective DA converters 21, 22 and 23 (1-bit DA converters) of FIGS. 7 to 9.

When the 1-bit DA converter is used in the continuous-time band-pass ΔΣ AD modulator, the output signal from the NRZDA converter 21 at a sampling timing "k" is represented by the following equations (where "k" is any integer, and k=0, ±1, ±2, ±3, . . . ):

(1) When the digital input signal is "1":

$$D_{out,NRZ}(t) \equiv 1, \left(\text{where } \frac{k}{f_S} \leq t \leq \frac{k+1}{f_S}\right). \quad (1)$$

(2) When the digital input signal is "1":

$$D_{out,NRZ}(t) \equiv -1, \left(\text{where } \frac{k}{f_S} \leq t \leq \frac{k+1}{f_S}\right). \quad (2)$$

On the other hand, the output signal from the RFDA converter 22 is represented by the following equations:

(1) When the digital input signal is "1":

$$D_{out,RF}(t) \equiv A_1(t), \left(\text{where } \frac{k}{f_S} \leq t \leq \frac{k+1/2}{f_S}\right), \text{ and} \quad (3)$$

$$D_{out,RF}(t) \equiv A_2(t), \left(\text{where } \frac{k+1/2}{f_S} \leq t \leq \frac{k+1}{f_S}\right). \quad (4)$$

(2) When the digital input signal is "0":

$$D_{out,RF}(t) \equiv A_2(t), \left(\text{where } \frac{k}{f_S} \leq t \leq \frac{k+1/2}{f_S}\right), \text{ and} \quad (5)$$

$$D_{out,RF}(t) \equiv A_1(t), \left(\text{where } \frac{k+1/2}{f_S} \leq t \leq \frac{k+1}{f_S}\right), \quad (6)$$

where, $$A_1(t) = -\frac{1}{2}\cos\{2\pi(2f_S)t\} + \frac{1}{2}, \text{ and} \quad (7)$$

$$A_2(t) = \frac{1}{2}\cos\{2\pi(2f_S)t\} - \frac{1}{2}. \quad (8)$$

In this case, $A_1(t)$ denotes a signal obtained by biasing a cosine wave having a frequency 2fs so as to be a higher level so that the lowest level of the biased cosine wave becomes a zero level. In addition, $A_2(t)$ denotes a signal obtained by biasing the cosine signal with the frequency 2fs so as to be a lower level so that the highest level of the biased cosine wave becomes the zero level. The RFDA converter 22 operates as follows. When the digital input signal is "1", the RFDA converter 22 outputs a signal waveform which switches over from the signal $A_1(t)$ to the signal $A_2(t)$ at a timing 1/(2fs), as shown in FIG. 12 A. In addition, when the digital input signal is "0", the RFDA converter 22 outputs a signal waveform which switches over from the signal $A_2(t)$ to the signal $A_1(t)$ at the timing 1/(2fs), as shown in FIG. 12B.

Figure 13:
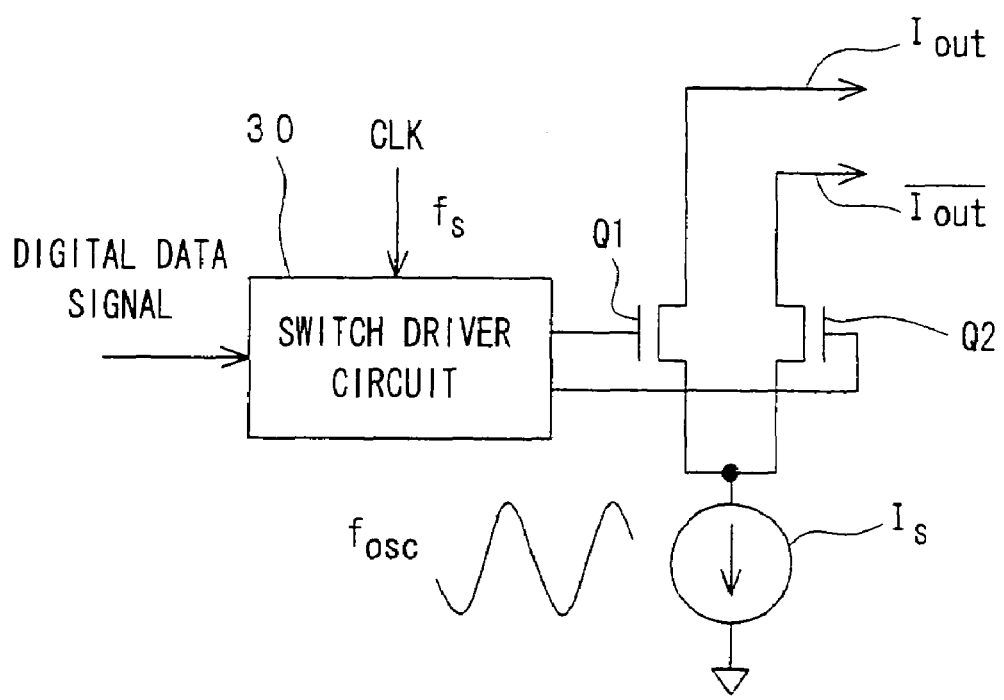
FIG. 13 is a circuit diagram showing a configuration of a 1-bit RFDA converter 14 of FIG. 11.

FIG. 13 is a circuit diagram showing a configuration of the 1-bit RFDA converter 14 of FIG. 11. The above RFDA converter 22 can be realized by a relatively simple circuit as configured so that a differential pair of transistors is connected to a tail current source $I_s$ which has one grounded terminal and outputs an alternating-current (AC) signal of cos {2π(2fs)t}. Referring to FIG. 13, MOS field-effect transistors (each referred to as a MOSFET hereinafter) Q1 and Q2 constituting one pair of switching elements are alternately turned on, respectively, in response to control signals from a switch driver circuit 30. This leads to that the analog signals (FIG. 10) Iout and $\overline{\text{Iout}}$ represented by the equations 3 to 6 are generated and outputted. The paired control signals from the switch driver circuit 30 are applied to gates of the respective MOSFETs Q1 and Q2, the current source $I_s$ is connected to sources of the respective MOSFETs Q1 and Q2, and the sources of the MOSFETs Q1 and Q2 become output terminals for outputting the output signals, respectively. The switch driver circuit 30 generates and outputs the control signals based on a digital data signal, according to a sampling clock having the sampling frequency "fs" which is in synchronization with the AC current having an AC frequency fosc.

Figure 14:
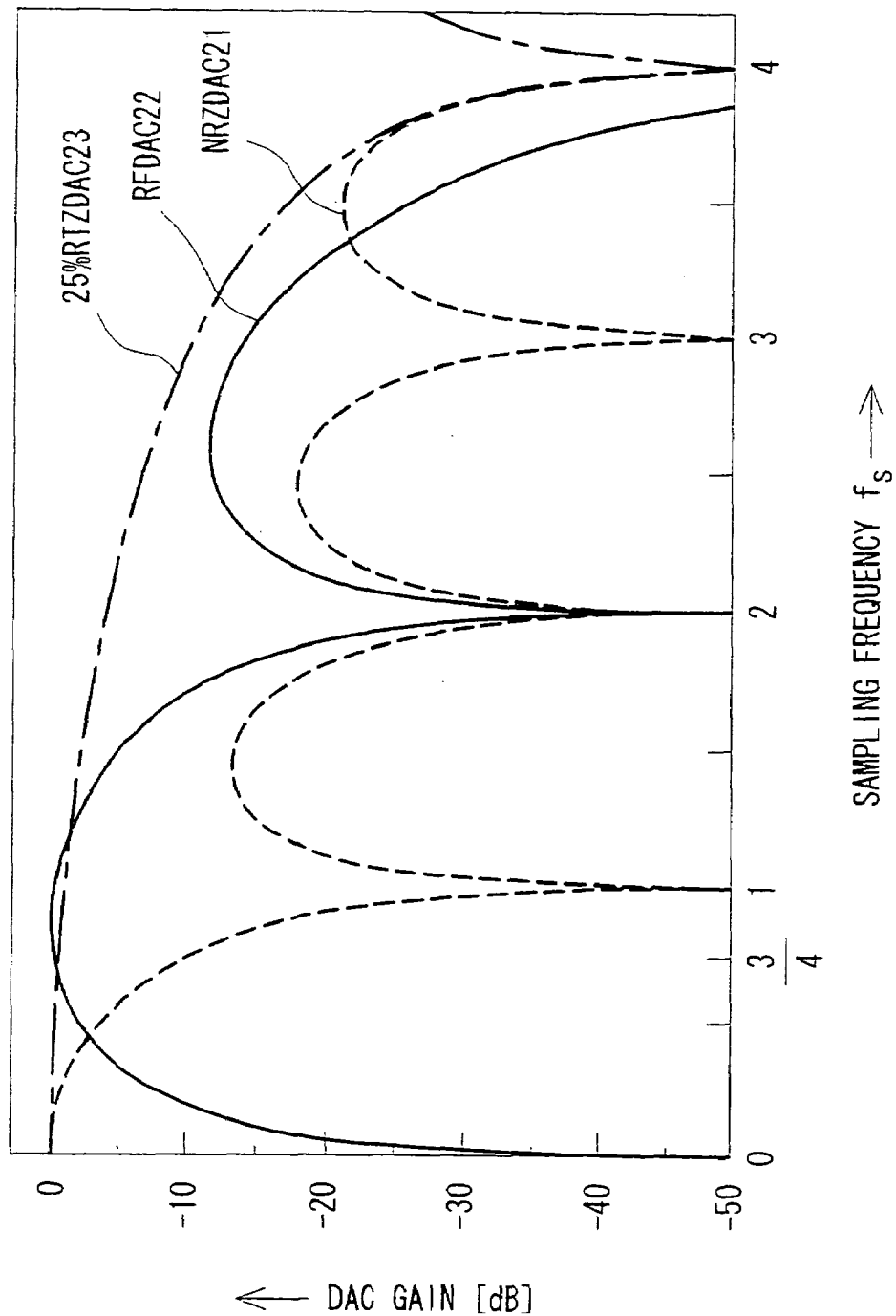
FIG. 14 is a spectral diagram showing gain-frequency characteristics of the respective DA converters 21, 22 and 23 of FIGS. 12A and 12B.

FIG. 14 is a spectral diagram showing gain-frequency characteristics of the respective DA converters 21, 22 and 23 of FIGS. 12A and FIG. 12B. As shown in FIGS. 12A and 12B, the power spectrum of an impulse response of the RFDA converter 22 becomes the maximum at the frequency near the frequency (¾)fs, and the DC component thereof becomes zero. In the circuit configuration of FIG. 11 according to the present preferred embodiment, the subsampling is realized at the input frequency (¾)fs utilizing the above-mentioned gain characteristics. In addition, there are the following properties represented by the following equations with respect to any integer "k" (where k=0, ±1, ±2, ±3, . . . ):

$$A_1\left(\frac{k}{2f_S}\right) = 0, \quad (9)$$

$$A_2\left(\frac{k}{2f_S}\right) = 0, \quad (10)$$

$$\left.\frac{dA_1}{dt}\right|_{t=\left(\frac{k}{2f_S}\right)} = 0, \text{ and} \quad (11)$$

$$\left.\frac{dA_2}{dt}\right|_{t=\left(\frac{k}{2f_S}\right)} = 0. \quad (12)$$

In this case, when an output value and an output slew rate are both nearly zero, the switching of the sampling clock is performed. Due to this, it is considered that the influence of the jitter (See the ninth non-patent document, for example) is small.

In the preferred embodiment described so far, the 1-bit RFDA converter 14 of FIG. 13 switches the cosine wave signal to generate the analog signal, however, the present invention is not limited to this. The above analog signal may be a signal having continuous values that satisfy at least the equations (9) to (12). Preferably, the analog signal value and gradient of the signal are both zero at a timing t=k(2fs) (where "k" is any integer), and the analog signal has continuous values gradually increasing or decreasing at a timing near the timing t=k/(2fs).

In the present preferred embodiment described so far, the current output type 1-bit RFDA converter 14 is disclosed in FIG. 13. However, as will be described later in detail with reference to FIG. 15, a voltage output type RFDA converter may be employed.

Second Preferred Embodiment

Figure 15:
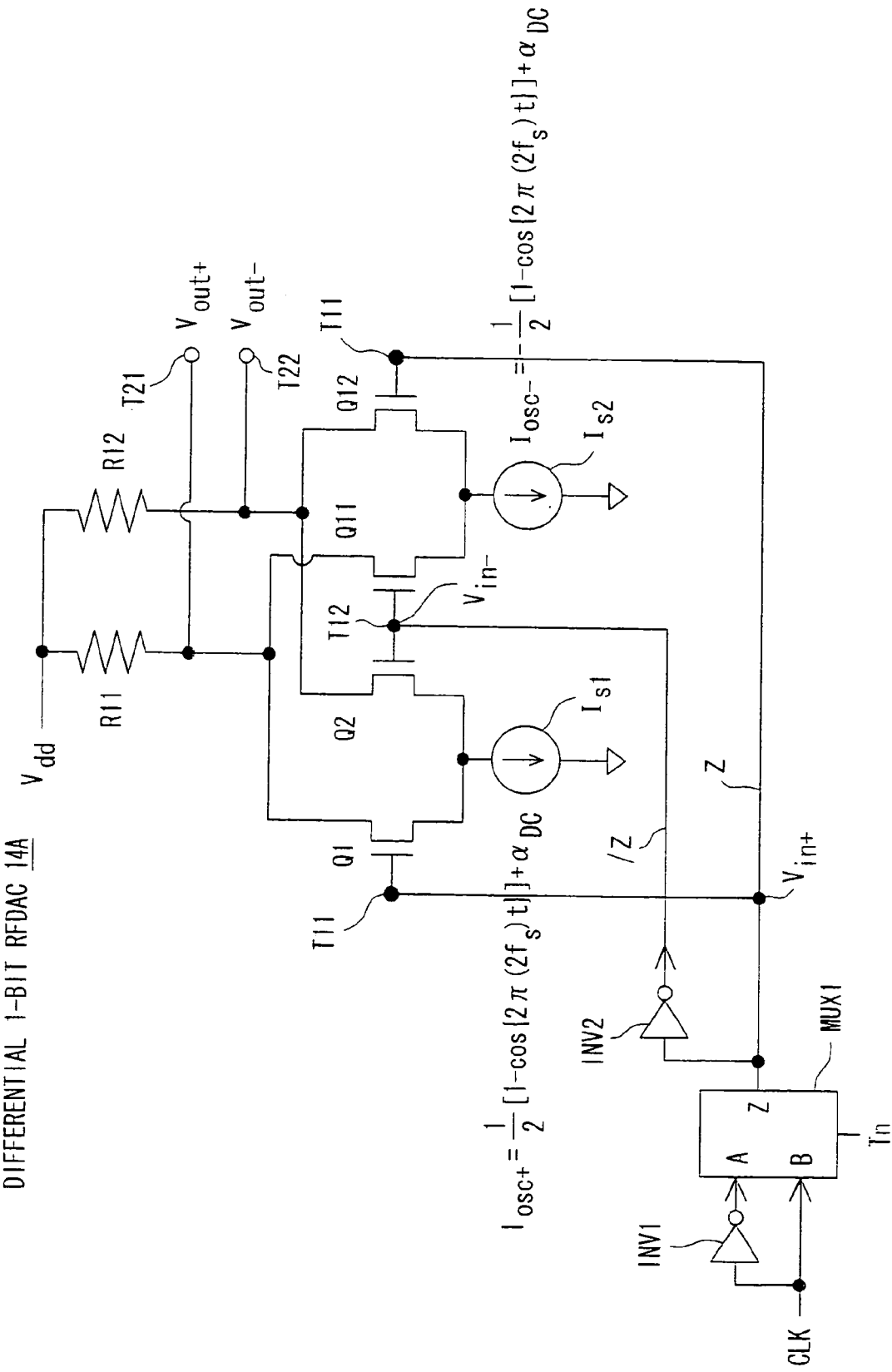
FIG. 15 is a circuit diagram showing a configuration of a differential 1-bit RFDA converter 14A according to a second preferred embodiment of the present invention.

FIG. 15 is a circuit diagram showing a configuration of a differential 1-bit RFDA converter 14A according to a second preferred embodiment of the present invention. The second preferred embodiment is characterized in that the RFDA converter is configured as a voltage output type differential RFDA converter, as compared with the first preferred embodiment. Referring to FIG. 15, the differential 1-bit RFDA converter 14A includes an input signal processing circuit, which is constituted by a multiplexer MUX1 and two inverters INV1 and INV2 and provided at the previous stage of input terminals T11 and T12. Further, two pairs of switching elements MOSFETs Q1 and Q2, and Q11 and Q12 are connected between the input terminals T11 and T12, and output terminals T21 and T22. A current source $I_{S1}$ is connected to the MOSFETs Q1 and Q2, and a current source $I_{S2}$ is connected to the MOSFETs Q11 and Q12. In addition, in order to provide the RFDA converter 14A as the voltage output type RFDA converter, respective sources of the respective MOSFETs Q1, Q2, Q11 and Q12 are connected to a voltage source $V_{dd}$ via resistors R11 and R12, respectively. In this case, current signals $I_{osc+}$ and $I_{osc-}$ from the current sources $I_{S1}$ and $I_{S2}$ are represented by the following equations, respectively:

$$I_{osc+}=(\tfrac{1}{2})[1-\cos\{2\pi(2fs)t\}+\alpha_{DC}], \text{ and}$$

$$I_{osc-}=-(\tfrac{1}{2})[1-\cos\{2\pi(2fs)t\}+\alpha_{DC}].$$

Figure 16:
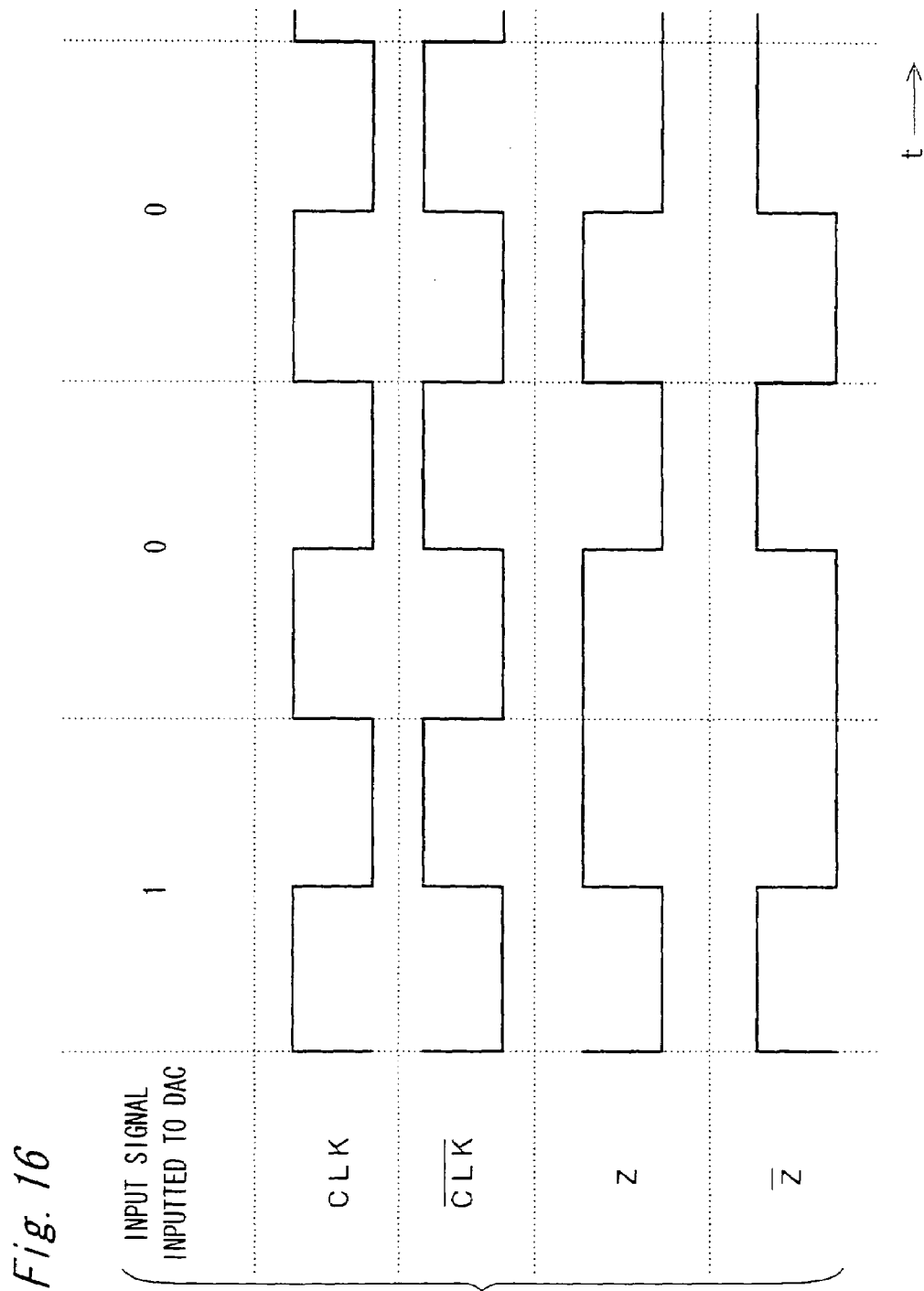
FIG. 16 is a timing chart showing timings of respective signals, and showing an operation of a multiplexer MUX 1 of FIG. 15.

In the circuit configuration of FIG. 15, at a certain first timing, a control voltage signal $V_{in+}$ is set to a high level and a control signal $V_{in-}$ is set to a low level. On the other hand, at a second timing a half cycle after the first timing, the control voltage signal $V_{in+}$ is set to the low level and the control signal $V_{in-}$ is set to the high level. FIG. 16 is a timing chart showing timings of respective signals, and showing an operation of the multiplexer MUX 1 of FIG. 15. By controlling the multiplexer MUX1 based on an input signal Tn inputted to the DA converter, the sampling clock CLK is processed as shown in FIG. 16, and the control voltage signal $V_{in+}$ of a non-inverted output signal "Z" and the control voltage signal $V_{in-}$ of an inverted output signal Z are generated and outputted to the terminals T11 and T12, respectively.

Figure 17:
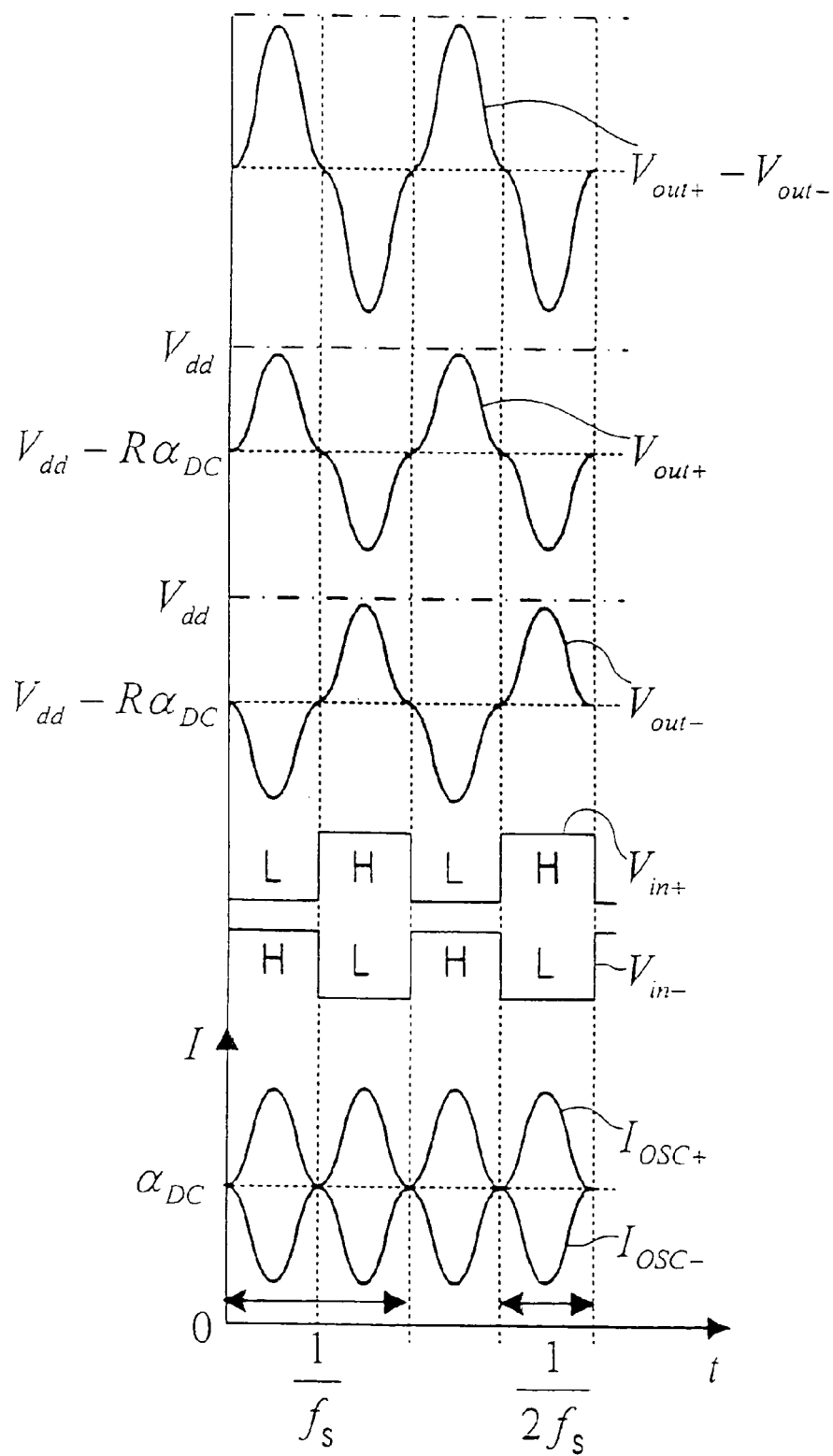
FIG. 17 is a waveform chart showing signal waveforms of respective voltages of FIG. 15.
Figure 18:
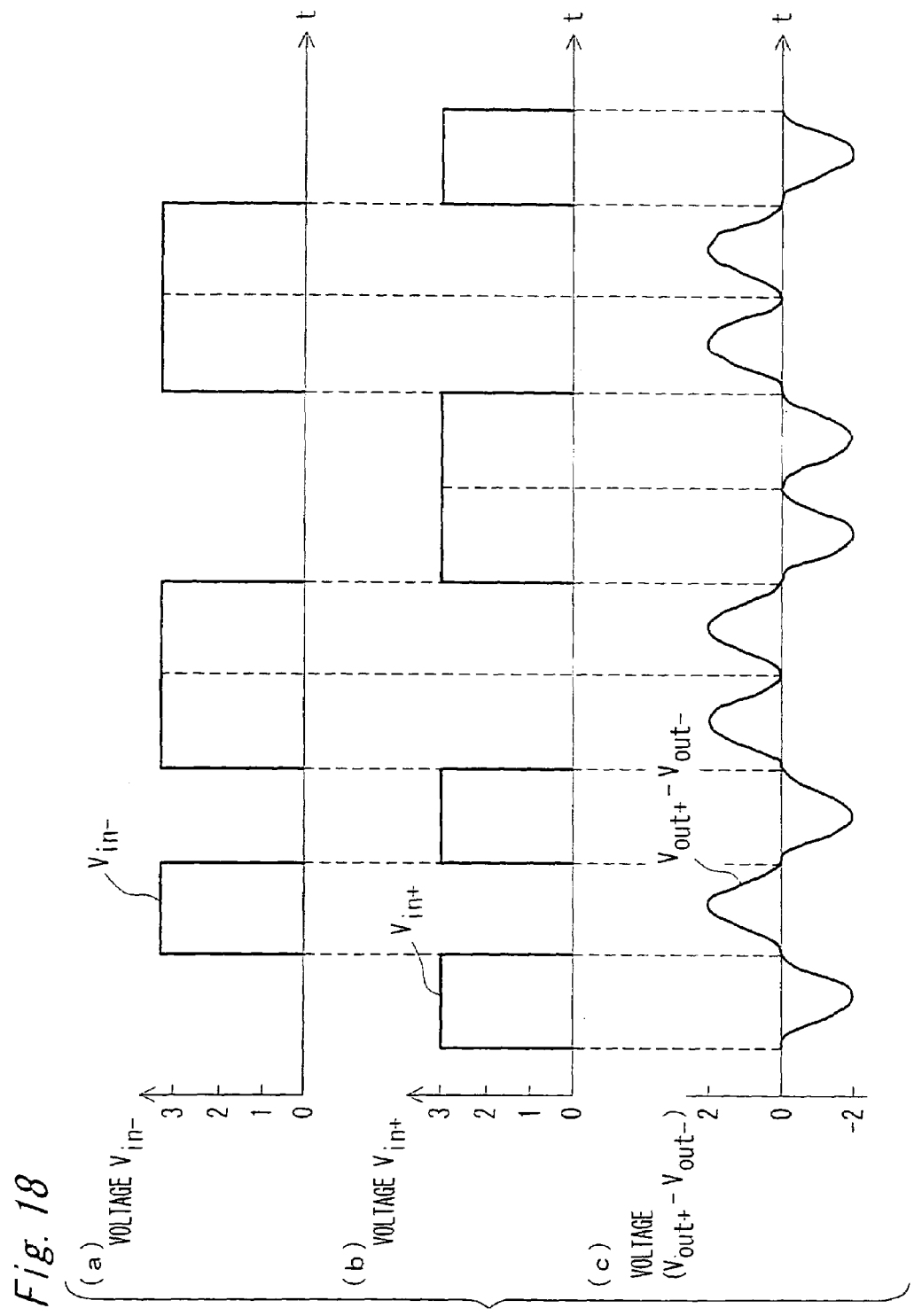
FIG. 18 is a waveform chart showing signal waveforms of respective voltages, and showing simulation results of FIG. 15.

The circuit of FIG. 15 inputs the signals and operates as shown in FIG. 17. Accordingly, as apparent from FIG. 17, the differential 1-bit RFDA converter 14A can be constituted. FIG. 18 is a waveform chart showing waveforms of the respective voltage signals, and showing a simulation result of FIG. 15. As shown in FIG. 18, the differential 1-bit RFDA converter 14A operates as intended. The circuit of FIG. 15 may be applied to a differential 3-bit or multi-bit RFDA converter described below.

The 1-bit differential RFDA converter configured as described so far can allow the signal amplitude to be larger, is hardly affected by the noise, and can always apply any current. Accordingly, the 1-bit differential RFDA converter exhibits such an advantageous effect, that a common mode voltage noise becomes extremely small, and the converter is hardly affected by any distortion.

Third Preferred Embodiment

Figure 19:
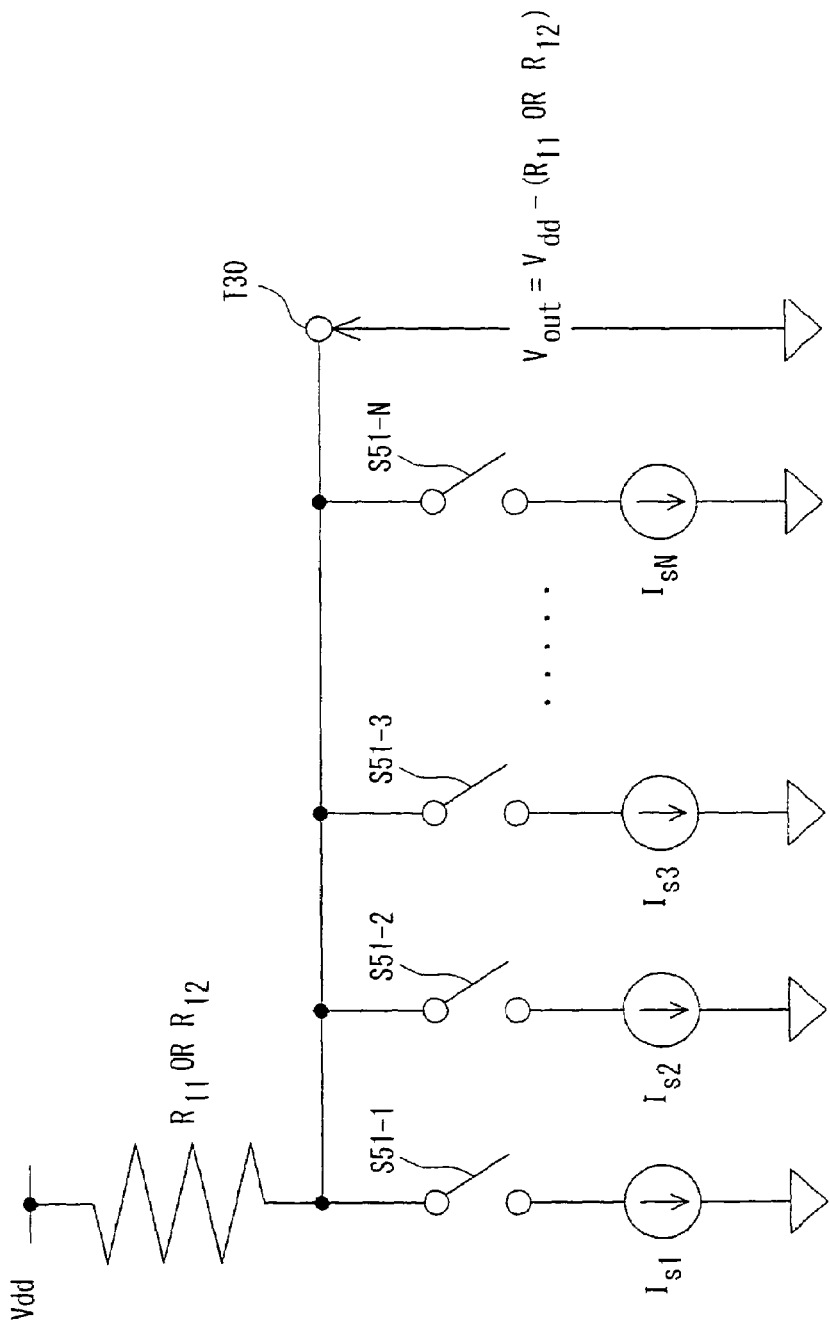
FIG. 19 is a conceptual view of a circuit configuration of a segment type 3-bit RFDA converter 14B according to a third preferred embodiment of the present invention.
Figure 20:
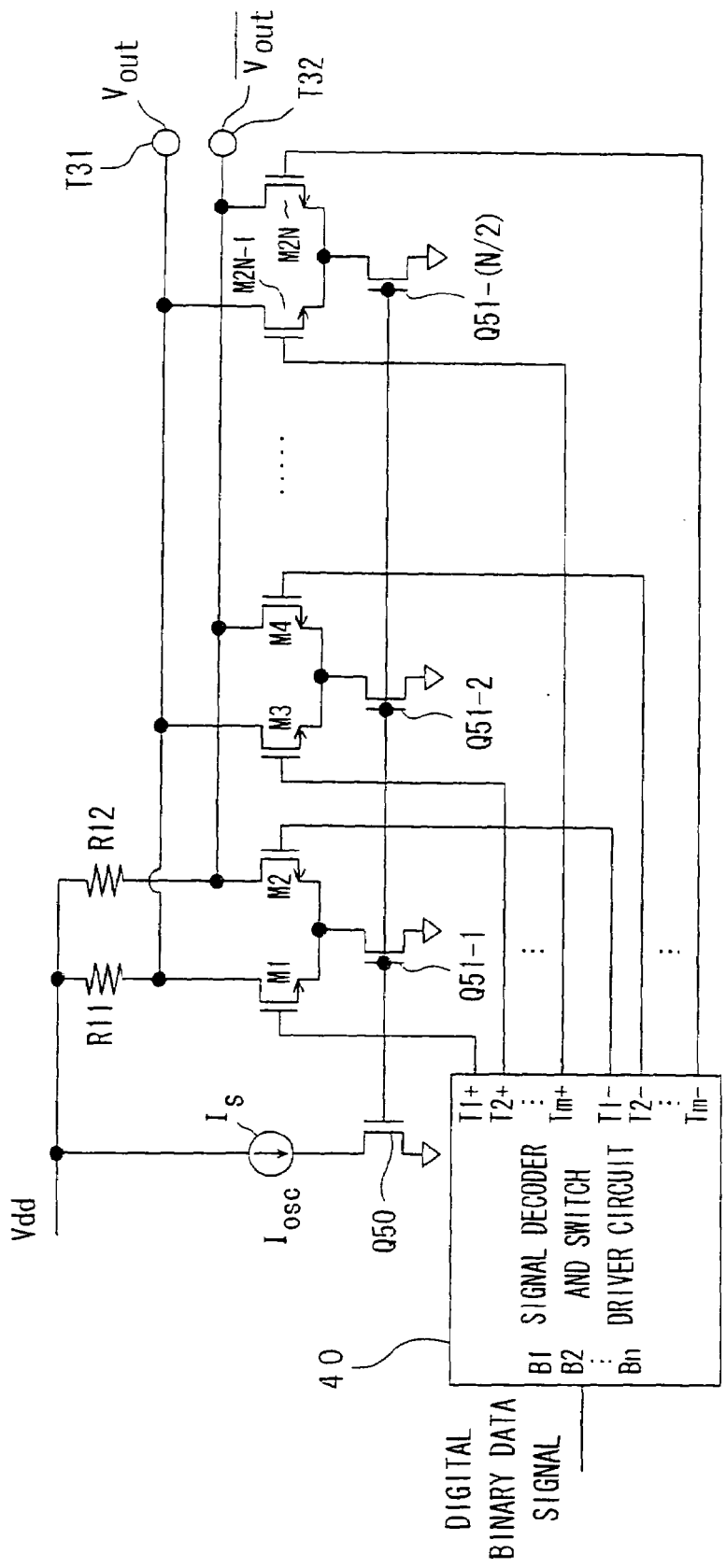
FIG. 20 is a circuit diagram showing a configuration of the segment type 3-bit RFDA converter 14B according to the third preferred embodiment of the present invention.

FIG. 19 is a conceptual view of a circuit configuration of a segment type 3-bit RFDA converter 14B according to a third preferred embodiment of the present invention, and FIG. 20 is a circuit diagram showing a configuration of the segment type 3-bit RFDA converter 14B according to the third preferred embodiment of the present invention. Referring to FIG. 19, a voltage source $V_{dd}$ is grounded via a resistor R11 or R12, and respective switches S51-1 to S51-N and respective current sources $I_{S1}$ to $I_{SN}$. In addition, a connection point between the resistor R11 or R12 and one end of each of the switches S51-1 and S51-N becomes an output terminal T30 for outputting the analog signal.

When the circuit of FIG. 19 is actually constituted, the plurality of "N" current sources $I_{S1}$ to $I_{SN}$ are replaced by one current source $I_S$ as shown in FIG. 20. Referring to FIG. 20, the voltage source $V_{dd}$ is grounded via the current source $I_S$ and a MOSFET Q50 of a switching element. In addition, the voltage source $V_{dd}$ is grounded via the resistor R11, and switching elements MOSFETs M1, M3, . . . , and M(2N−1) and MOSFETs Q51-1, Q51-2, . . . , and Q51-(N/2) each of a switching element. Further, the voltage source $V_{dd}$ is grounded via the resistor R12, and switching elements MOSFETs M2, M4, . . . , and M(2N) and the MOSFETs Q51-1, Q51-2, . . . , and Q51-(N/2) each of a switching element. A signal decoder and switch driver circuit 40 converts inputted digital binary data signals into thermometer codes, then generates control signals for controlling the MOSFETs M1, M2, M3, . . . , and M(2N) of the switching elements, and applies the generated control signals to gates of the respective MOSFETs M1, M2, M3, . . . , and M(2N). In this case, Table 1 shown below is a conversion table used when the digital binary data signals B2, B1, and B0 are converted into the thermometer codes T7 to T1.

TABLE 1

| B2 | B1 | B0 | T7 | T6 | T5 | T4 | T3 | T2 | T1 |
|----|----|----|----|----|----|----|----|----|----|
| 0  | 0  | 0  | 0  | 0  | 0  | 0  | 0  | 0  | 0  |
| 0  | 0  | 1  | 0  | 0  | 0  | 0  | 0  | 0  | 1  |
| 0  | 1  | 0  | 0  | 0  | 0  | 0  | 0  | 1  | 1  |
| 0  | 1  | 1  | 0  | 0  | 0  | 0  | 1  | 1  | 1  |
| 1  | 0  | 0  | 0  | 0  | 0  | 1  | 1  | 1  | 1  |
| 1  | 0  | 1  | 0  | 0  | 1  | 1  | 1  | 1  | 1  |
| 1  | 1  | 0  | 0  | 1  | 1  | 1  | 1  | 1  | 1  |
| 1  | 1  | 1  | 1  | 1  | 1  | 1  | 1  | 1  | 1  |

Figure 29:
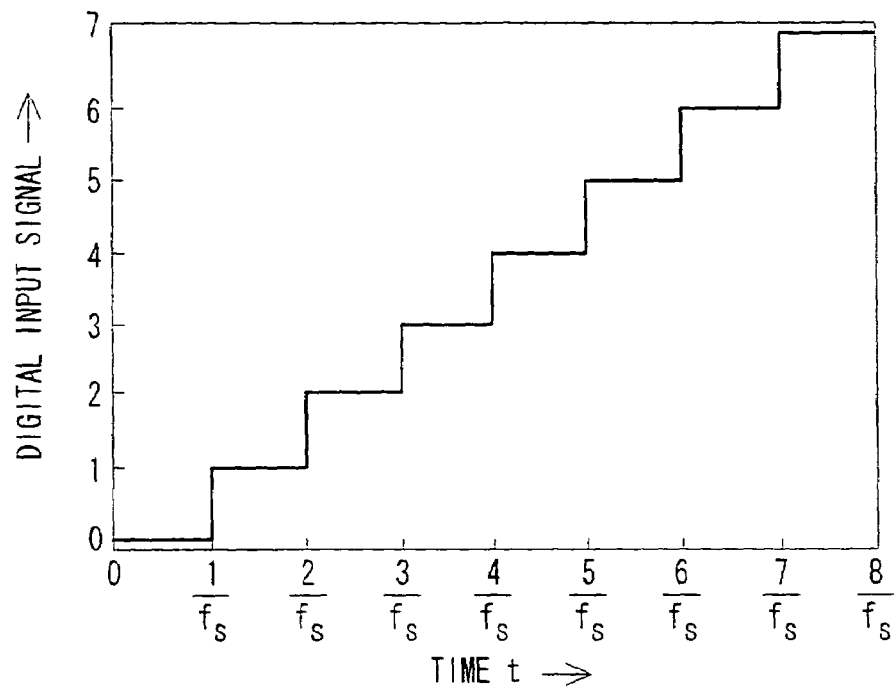
FIG. 29 is a diagram showing a waveform of a digital input signal inputted to a 3-bit RFDA converter 14a of FIG. 28.
Figure 30:
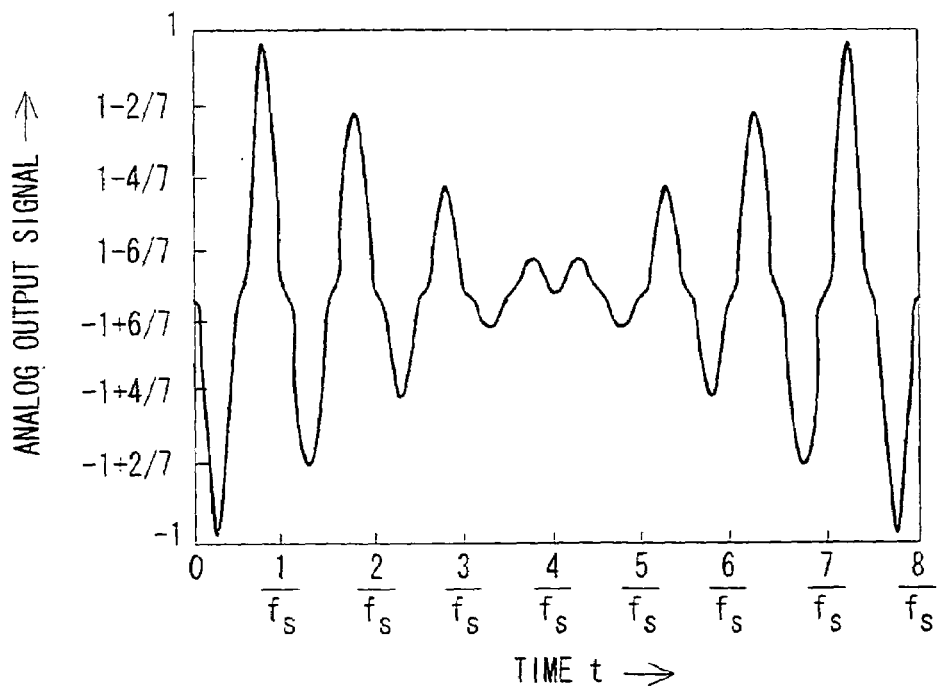
FIG. 30 is a diagram showing a waveform of an analog signal outputted from the 3-bit RFDA converter 14a of FIG. 28.

A circuit constituted by the MOSFETs M1, M2, M3, . . . , and M(2N) each of a switching element is equivalent to such a configuration in that seven 1-bit RFDA converters are connected in parallel to each other. The MOSFETs M1, M2, M3, . . . , and M(2N) are controlled to be turned on or off based on the control signal of a thermometer code after the conversion. Accordingly, as the number of switching elements that are turned on increases, the current amount increases and the voltage which is proportional to the current increases. As shown in FIGS. 29 and 30, the voltage of the analog output signal obtained as described above changes in response to the digital input signal. The segment type 3-bit RFDA converter 14B outputs DA-converted analog signals from output terminals T31 and T32 connected to one ends of the resistors R11 and R12, respectively.

The segment type 3-bit RFDA converter configured as described so far exhibits such an advantageous effect that a glitch noise can be reduced and the monotony between the input and the output thereof can be established.

According to the respective preferred embodiments stated so far are characterized by being constituted as follows. Namely, the highest input frequency "fin" of the inputted analog signal is substantially set to the three-fourths of the sampling frequency "fs". In addition, each of the DA converters 14 14A, and 14B converts the inputted digital signal into the analog signal, and outputs the analog signal, which is inverted or not in response to a value of the inputted digital signal and has an amplitude of substantially zero and a gradient of substantially zero at the timing k/(2fs), where "k" is any integer. In addition, it is preferable that each of the analog signals outputted from the DA converters 14, 14A, and 14B changes so as to have a smaller gradient at the timing near the timing k/(2fs) than gradients at the other timings other than timings near the timing k/(2fs), (the other timings excluding timings corresponding to the maximum point and the minimum point of the analog signal). Preferably, each of the DA converters 14, 14A and 14B generates the analog signals by switching a predetermined alternating current signal based on the value of the inputted digital input signal and by applying a predetermined bias voltage to the switched signal. It is further preferable that each of the DA converters 14, 14A and 14B is a multi-bit DA converter, and the AD converter 13 is a multi-bit AD converter. Then, the conversion precision can be improved as compared with that of the 1-bit DA converter or 1-bit AD converter. In the preferred embodiments described so far, the analog band-pass filter is the continuous-time analog band-pass filter 12, however, the present invention is not limited to this. When a discretization interval is set to be sufficiently small, the analog band-pass filter may be discrete-time analog band-pass filter.

FIRST IMPLEMENTAL EXAMPLE

In order to confirm the operation by the simulations, and of the continuous-time band-pass ΔΣ AD modulator according to the above-stated preferred embodiments, the inventors of the present invention carried out simulations using a MATLAB (registered trademark) tool.

Figure 21:
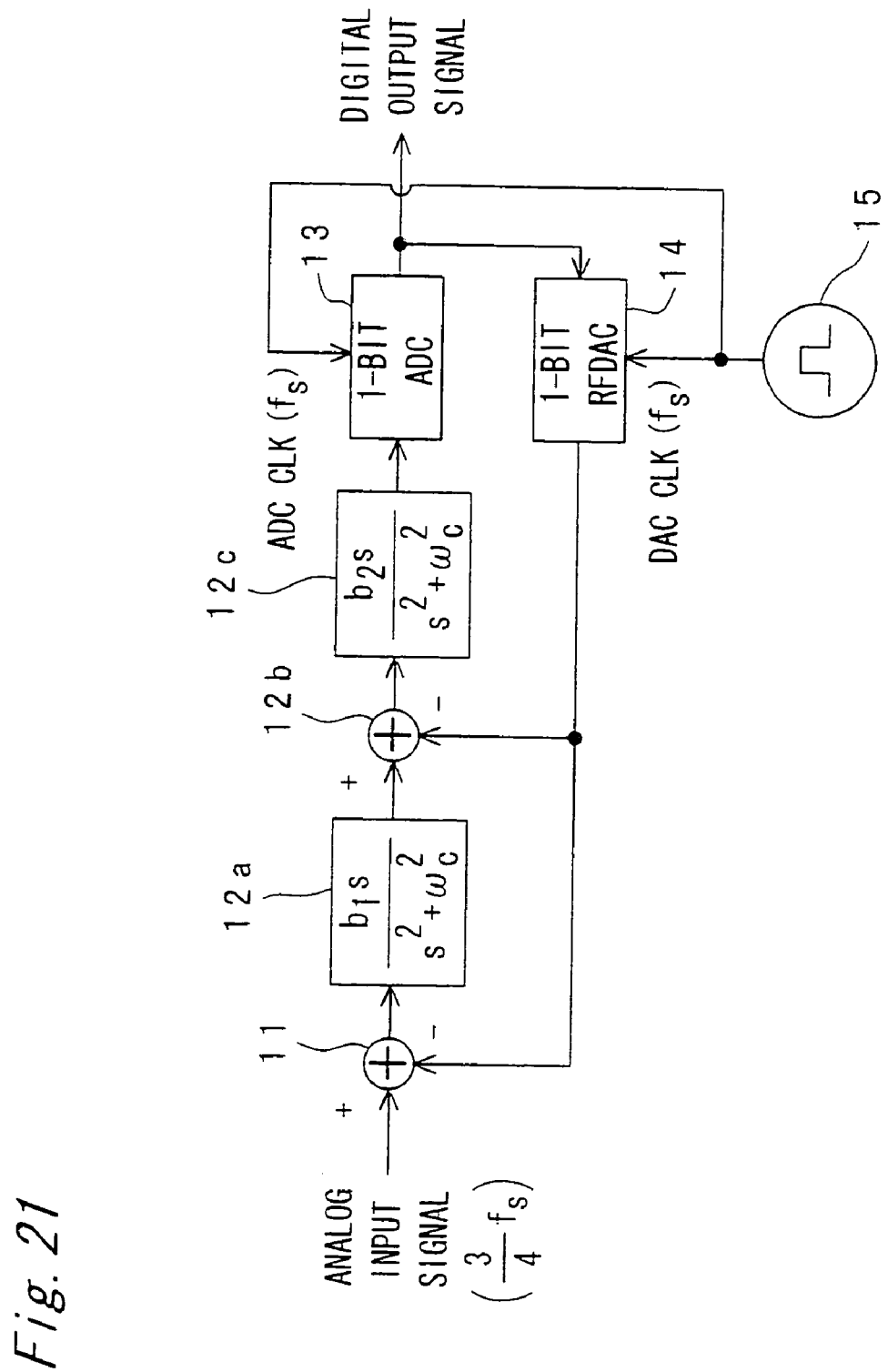
FIG. 21 is a bock diagram showing a configuration of a band-pass ΔΣ AD modulator according to a first implemental example of the first preferred embodiment.

FIG. 21 is a bock diagram showing a configuration of a band-pass ΔΣ AD modulator according to a first implemental example of the first preferred embodiment. Referring to FIG. 21, the band-pass ΔΣ AD modulator according to the first implemental example is characterized by constituting the continuous-time analog band-pass filter 12 by a second-order continuous-time band-pass filter that includes two filters 12a and 12c and a subtracter 12b inserted between the filters 12a and 12b, as compared with the circuit configuration of FIG. 11. In this case, the analog signal outputted from the subtracter 11 is outputted to the subtracter 12b via the filter 12a having a transfer function $(b_1 s/(s^2+\omega_c^2))$. The subtracter 12b subtracts the analog signal from the 1-bit RFDA converter, from the analog signal from the filter 12a, and outputs an analog signal having the subtraction result to the 1-bit AD converter 13 via the filter 12c having a transfer function $(b_2 s/(s^2+\omega_c^2))$. In this case, $\omega_c$ denotes a carrier wave frequency of the input analog signal.

In the first implemental example, in order to confirm the validity of the continuous-time band-pass ΔΣ AD modulator having the circuit configuration of FIG. 21, the simulation was carried out using the MATLAB (registered trademark) tool. In the modulator of FIG. 21, the 1-bit RFDA converter 14 was incorporated as the internal DA converter, and the second-order continuous-time band-pass filter having the central frequency (¾)fs was used as the loop filter. In the simulation, the analog signal having the highest input frequency fin≅(¾)fs was inputted to the modulator. The coefficients of the loop filters 12a and 12c were set as represented by the following equations, respectively. The highest input frequency "fin" of the inputted analog signal is pref erably set to be the same as or substantially the same as the three-fourths of the sampling frequency "fs":

$$\omega_c = 2\pi\left(\frac{3}{4}f_s\right), \tag{13}$$

$$b_1 = \frac{1.5}{30}\omega_c, \text{ and} \tag{14}$$

$$b_2 = \frac{5}{30}\omega_c. \tag{15}$$

The above coefficients are set so that the output amplitude of the filter is closer to 1 (that is, equal to or substantially equal to 1) when an output amplitude of the 1-bit RFDA converter 14 is set to 1.

Figure 22:
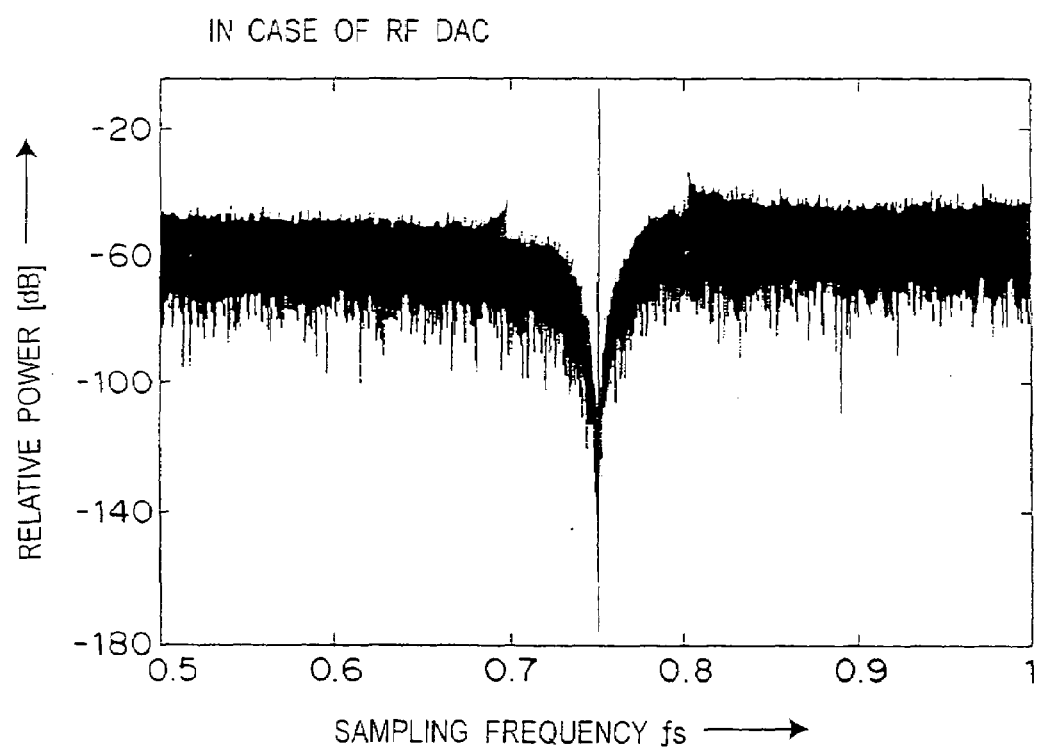
FIG. 22 is a diagram showing an output power spectrum of the continuous-time band-pass ΔΣ AD modulator when the RFDA converter is used as an internal DA converter of FIG. 21.
Figure 23:
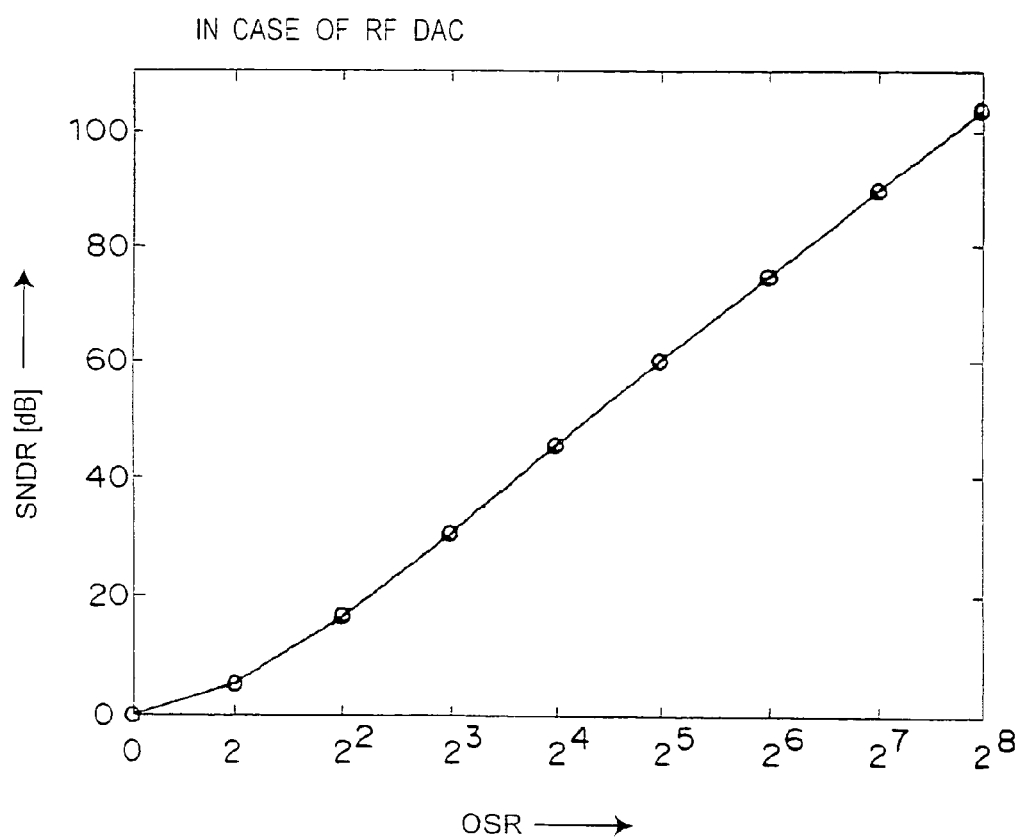
FIG. 23 is a diagram showing a characteristic of SNDR with respect to an oversampling rate (OSR) of the continuous-time band-pass ΔΣ AD modulator when the RFDA converter is used as the internal DA converter of FIG. 21.

FIG. 22 is a diagram showing an output power spectrum of the continuous-time band-pass ΔΣ AD modulator when the RFDA converter is used as the internal DA converter of FIG. 21. FIG. 23 is a diagram showing a characteristic of SNDR with respect to an oversampling rate (OSR) of the continuous-time band-pass ΔΣ AD modulator when the RFDA converter is used as the internal DA converter of FIG. 21. The output power spectrum of the modulator of FIG. 21 becomes as shown in FIG. 22, and the quantization noise is shaped at the frequency (¾)fs. As shown in FIG. 23, the SNDR of a ratio of ((noise power)+(distortion noise power)) to a signal power has a gradient 15 dB/oct., and it could be confirmed that the modulator having the circuit configuration according to the first implemental example operates as the second-order band-pass ΔΣ AD modulator that performs the subsampling.

Figure 24:
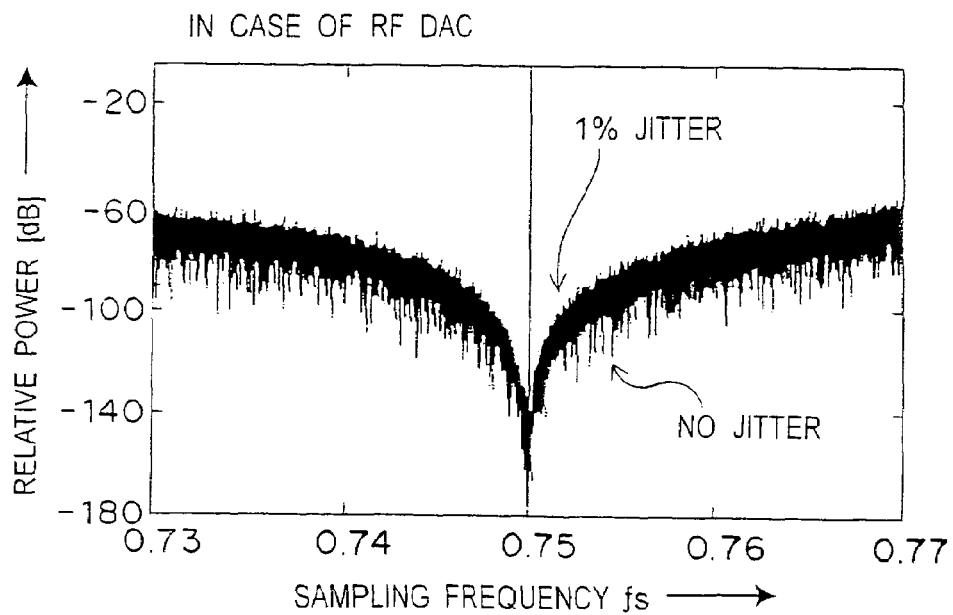
FIG. 24 is a diagram showing output power spectra of the continuous-time band-pass ΔΣ AD modulator with and without a jitter of a sampling clock of the internal DA converter, respectively, when the RFDA converter is used as the internal DA converter of FIG. 21.
Figure 25:
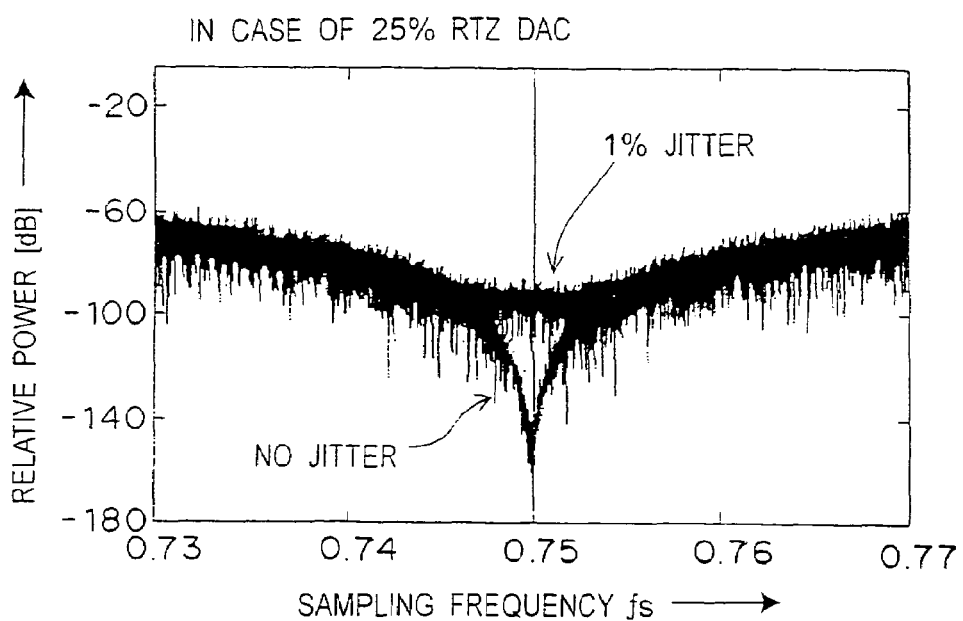
FIG. 25 is a diagram showing an output power spectra of the continuous-time band-pass ΔΣ AD modulator with and without the jitter of the sampling clock of the internal DA converter, respectively, when the 25% RTZDA converter is used as the internal DA converter of FIG. 21.

Next, the influence of the clock jitter in the DA converter on the precision of the band-pass ΔΣ AD modulator will be described below with reference to FIGS. 24 and 25. FIG. 24 is a diagram showing output power spectra of the continuous-time band-pass ΔΣ AD modulator with and without the jitter of the sampling clock of the internal DA converter, respectively, when the RFDA converter is used as the internal DA converter of FIG. 21. FIG. 25 is a diagram showing an output power spectra of the continuous-time band-pass ΔΣ AD modulator with and without the jitter of the sampling clock of the internal DA converter with and without, respectively, when the 25% RTZDA converter is used as the internal DA converter of FIG. 21.

The simulations were carried out under the following conditions. When the internal DA converter is the RFDA converter 14 or the RTZDA converter 23 (See the fourth non-patent document, for example) having a pulse width of 25%, a clock jitter having a Gaussian distribution is given in a range from −1% to +1% of the clock frequency "fs" to the clock of the DA converter 14. The output power spectra obtained as described above are shown in FIGS. 24 and 25, respectively. As apparent from FIGS. 24 and 25, when the 25% RTZDA converter 23 is used, the noise floor remarkably increases due to the influence of the jitter. On the other hand, when the RFDA converter 14 is used, the noise floor hardly changes.

Figure 26:
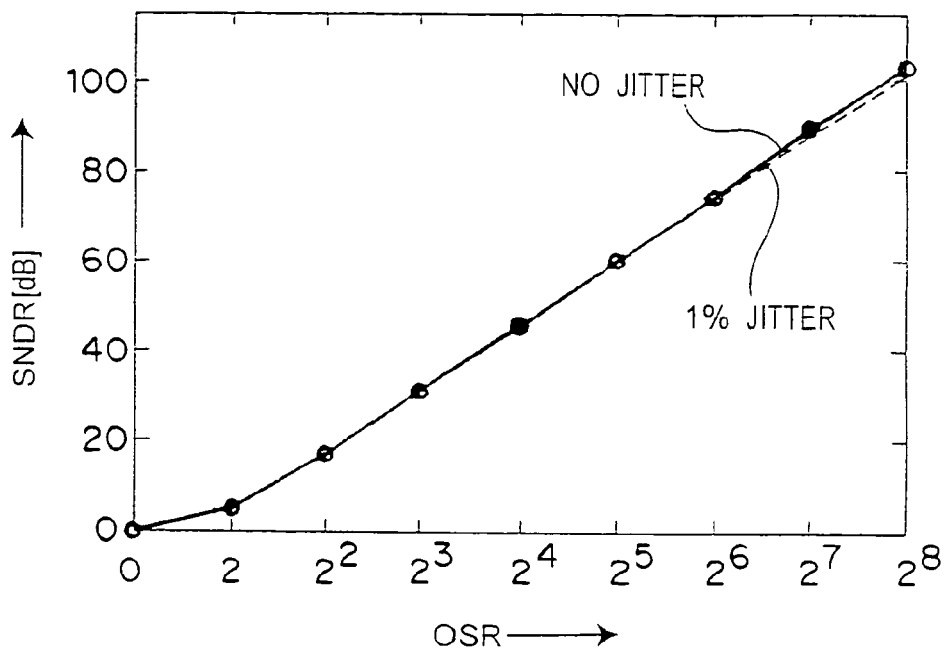
FIG. 26 is a graph showing changes in the SNDR with respect to the oversampling rate (OSR) of the continuous-time band-pass ΔΣ AD modulator with and without the jitter of the sampling clock of the internal DA converter, respectively, when the RFDA converter is used as the internal DA converter of FIG. 21.
Figure 27:
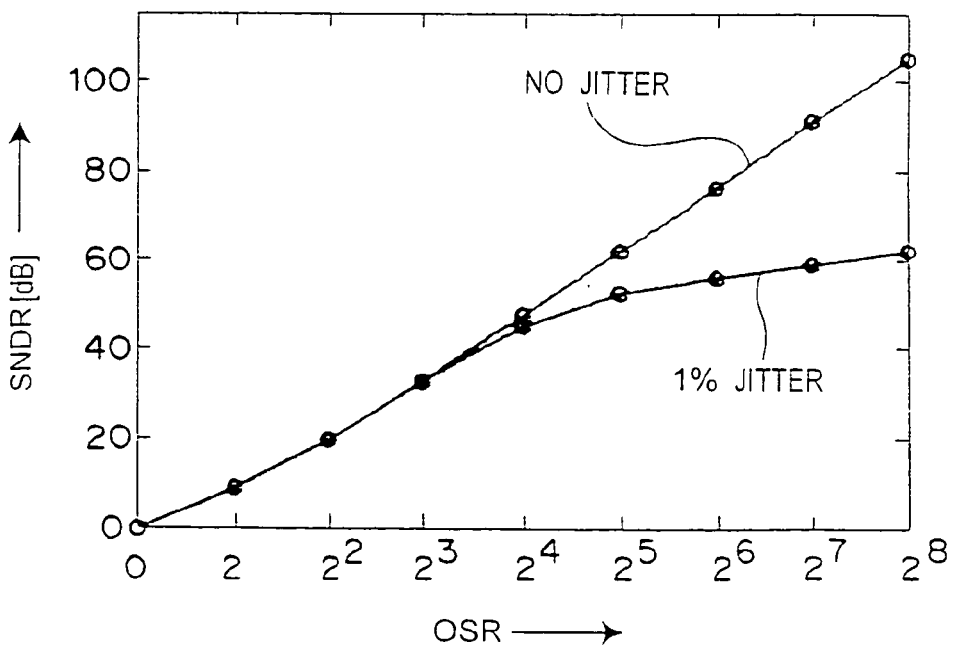
FIG. 27 is a graph showing changes in the SNDR with respect to the oversampling rate (OSR) of the continuous-time band-pass ΔΣ AD modulator with and without the jitter of the sampling clock of the internal DA converter, respectively, when the 25% RTZDA converter is used as the internal DA converter of FIG. 21.

FIG. 26 is a graph showing changes in the SNDR with respect to the oversampling rate (OSR) of the continuous-time band-pass ΔΣ AD modulator with and without the jitter of the sampling clock of the internal DA converter, respectively, when the RFDA converter is used as the internal DA converter of FIG. 21. FIG. 27 is a graph showing changes in the SNDR with respect to the oversampling rate (OSR) of the continuous-time band-pass ΔΣ AD modulator with and without the jitter of the sampling clock of the internal DA converter, respectively, when the 25% RTZDA converter is used as the internal DA converter of FIG. 21. As apparent from FIGS. 26 and 27, when the 25% RTZDA converter 23 is used, the SNDR greatly deteriorates. On the other hand, when the RFDA converter 14 is used, the deterioration is reduced.

SECOND IMPLEMENTAL EXAMPLE

Figure 28:
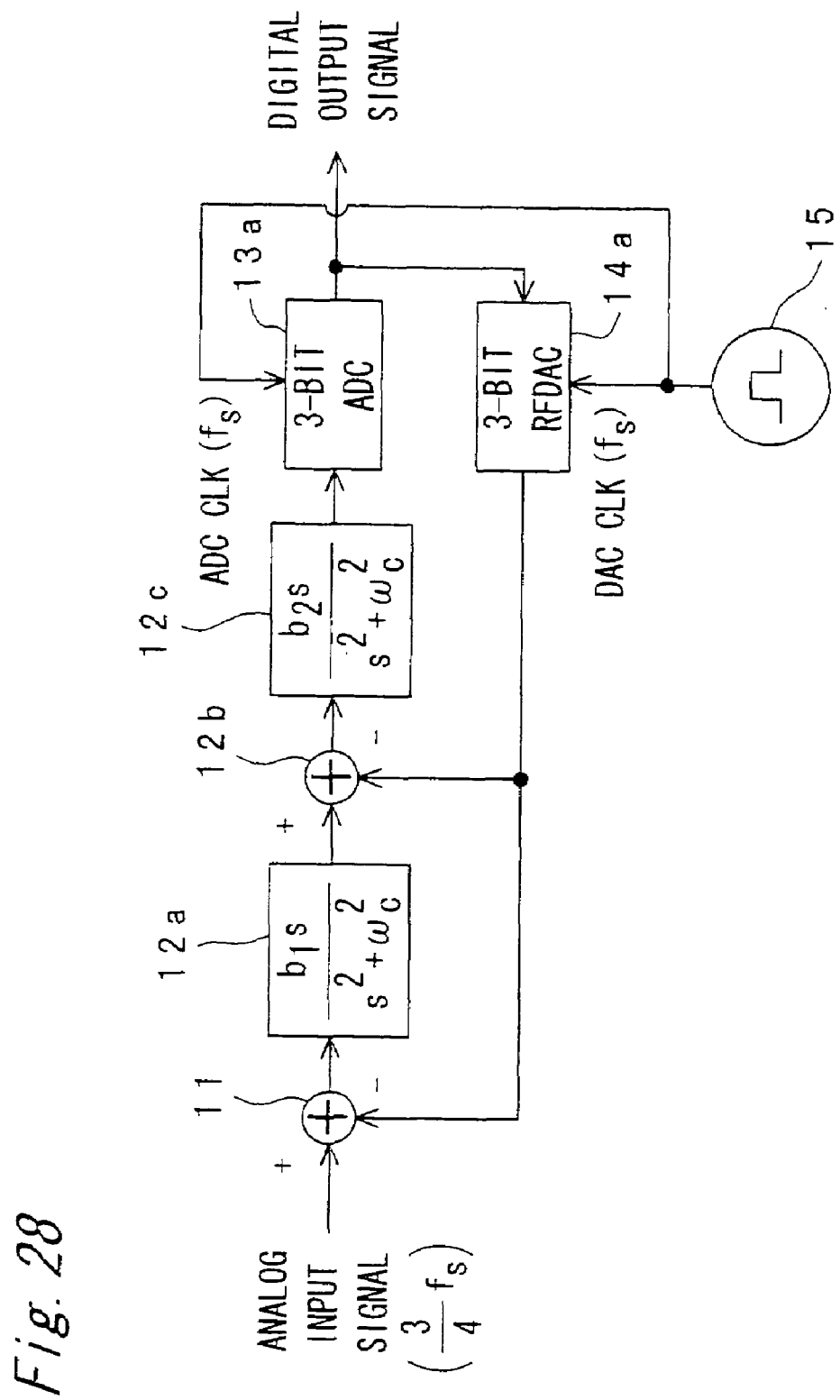
FIG. 28 is a bock diagram showing a configuration of a band-pass ΔΣ AD modulator according to a second implemental example of the third preferred embodiment.

FIG. 28 is a bock diagram showing a configuration of a band-pass $\Delta\Sigma$ AD modulator according to a second implemental example of the third preferred embodiment. In addition, FIG. 29 is a diagram showing a waveform of a digital input signal inputted to a 3-bit RFDA converter 14a of FIG. 28, and FIG. 30 is a diagram showing a waveform of an analog signal outputted from the 3-bit RFDA converter 14a of FIG. 28.

As shown in FIG. 28, in the second implemental example, as compared with the first implemental example of FIG. 21, a multi-bit DA converter 14a and a multi-bit AD converter 13a are used as the internal DA converter and the internal AD converter of the continuous-time band-pass $\Delta\Sigma$ AD modulator, respectively, so as to constitute a multi-bit continuous-time band-pass $\Delta\Sigma$ AD modulator. In this case, in the second implemental example, such an example is shown that the multi-bit is 3-bit. The multi-bit circuit configuration can realize AD conversion with higher precision.

A relationship between the input and output of the 3-bit RFDA converter 14a is shown in FIGS. 29 and 30. The simulations were carried out using the 3-bit RFDA converter 14a as the internal DA converter with the following conditions. In a manner similar to that of the case where the loop filter is incorporated in the 1-bit RFDA converter, the second-order continuous-time band-pass filter having the central frequency ($^3$⁄$_4$)fs and having coefficients set so that the output amplitude after filtering is closer to 1 when the largest output amplitude of the RFDA converter 14a is 1, is used as the loop filter. In the simulations, the analog signal having the highest input frequency fin≅($^3$⁄$_4$)fs was inputted to the modulator. The coefficients of the loop filter are represented by the following equations:

$$\omega_c = 2\pi\left(\frac{3}{4}f_s\right), \quad (16)$$

$$b_1 = \frac{3}{30}\omega_c, \text{ and} \quad (17)$$

$$b_2 = \frac{18}{30}\omega_c. \quad (18)$$

Figure 31:
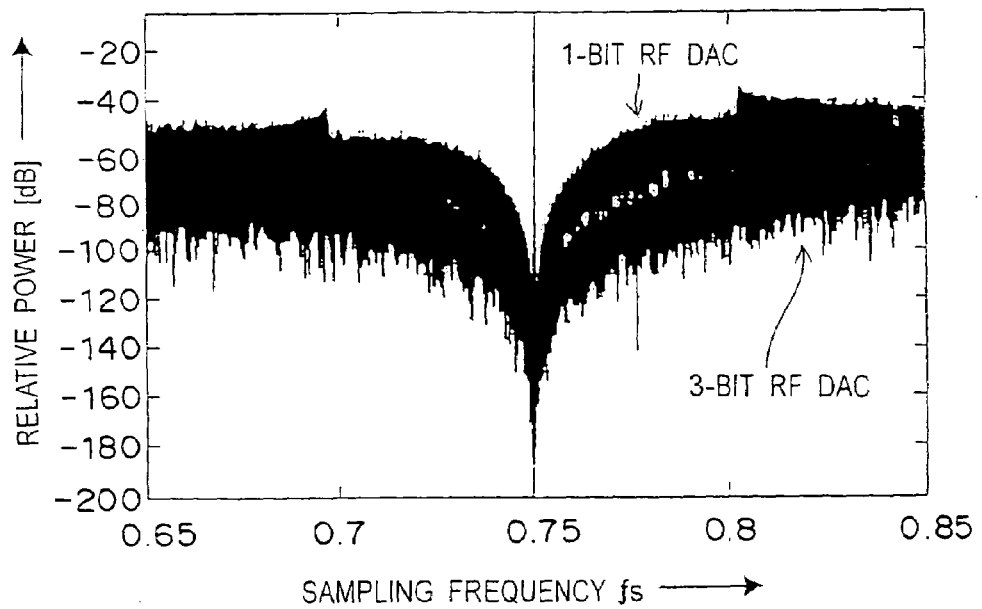
FIG. 31 is a diagram showing output spectra of the continuous-time band-pass ΔΣ AD modulator when a 1-bit RFDA converter and a 3-bit RFDA converter are used as the internal DA converter of FIG. 28, respectively.
Figure 32:
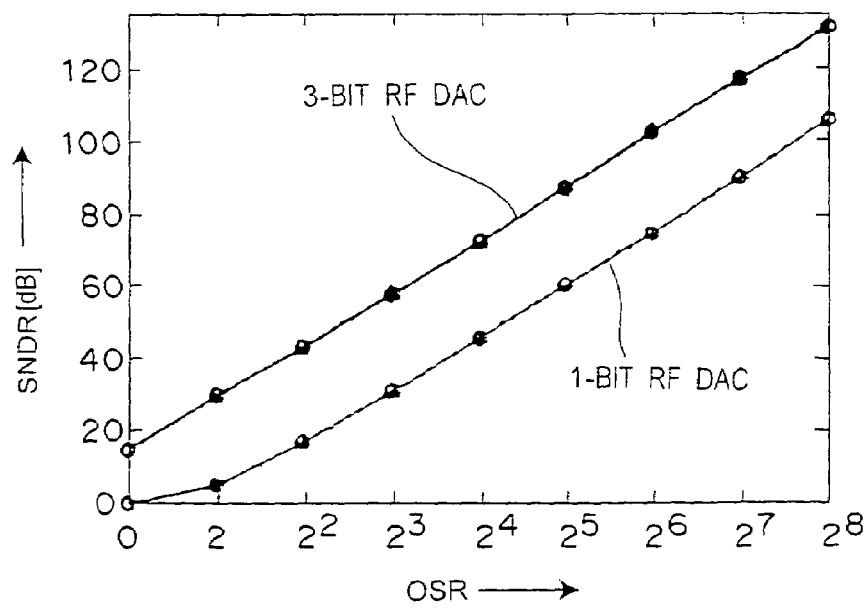
FIG. 32 is a graph showing changes in SNDR with respect to the oversampling rate (OSR) of the continuous-time band-pass ΔΣ AD modulator when the 1-bit RFDA converter and the 3-bit RFDA converter are used as the internal DA converter of FIG. 28, respectively.

FIG. 31 is a diagram showing output spectra of the continuous-time band-pass $\Delta\Sigma$ AD modulator when the 1-bit RFDA converter and the 3-bit RFDA converter are used as the internal DA converter of FIG. 28, respectively. FIG. 32 is a graph showing changes in SNDR with respect to the oversampling rate (OSR) of the continuous-time band-pass $\Delta\Sigma$ AD modulator when the 1-bit RFDA converter and the 3-bit RFDA converter are used as the internal DA converter of FIG. 28, respectively. In the second implemental example, as shown in FIG. 31, when the 3-bit AD converter 13a and the 3-bit RFDA converter 14a are used as the AD converter and the DA converter, respectively, the noise floor decreases as compared with the case where the 1-bit AD converter and the 1-bit RFDA converter are used as the AD converter and the DA converter, respectively. In addition, as shown in FIG. 32, the SNDR is increased by about 27 dB at an oversampling rate (OSR) of $2^5$. It is noted that, when the multi-bit configuration is used, the entire precision of the modulator relatively deteriorates because of nonlinearity of the output characteristic of the DA converter (See the sixth non-patent document, for example). Accordingly, the mismatching reducing method is required which utilizes an algorithm such as a DWA (Data Weighted Averaging; weighted averaging of data) algorithm. In this case, the DWA algorithm is provided for performing the dynamic element matching by providing a DSC circuit at the previous stage of an internal DA converter so as to perform noise-shaping on the nonlinearity of the multi-bit DA converter of the $\Delta\Sigma$ AD modulator (See the sixth non-patent document, for example).

As described so far, it was confirmed by the simulations that the subsampling can be realized by using the RFDA converter as the DA converter of the continuous-time band-pass $\Delta\Sigma$ AD modulator, and that the influence of the clock jitter having the disadvantageous effects of the continuous-time modulator can be reduced. The continuous-time band-pass $\Delta\Sigma$ AD modulator according to the preferred embodiments of the present invention utilizing the RFDA converter as the internal DA converter exhibits the following advantageous effects:

(i) The highest input frequency can be set to the three-fourths of the clock frequency at which the internal AD converter and the internal DA converter can operate. Namely, the continuous time band-pass $\Delta\Sigma$ AD modulator can deal with the input frequency three times as high as that dealt with by the modulator according to the prior art; and (ii) The influence of the jitter of the sampling clock to the DA converter on the deterioration in the precision of the entire AD modulator is extremely small. In addition, because of use of the continuous time $\Delta\Sigma$ AD modulator, the following advantageous effects can be exhibited as compared with the discrete-time $\Delta\Sigma$ AD modulator. Namely, the continuous time band-pass $\Delta\Sigma$ AD modulator can realize lower power consumption, can operate at a higher clock frequency, and can simplify an anti-aliasing filter provided at the previous stage of the $\Delta\Sigma$ AD modulator.

As described so far in detail, each of the band-pass $\Delta\Sigma$ AD modulator and the digital radio receiver using the same band-pass $\Delta\Sigma$ AD modulator according to the present invention is configured so that the highest input frequency "fin" of the inputted analog signal is substantially set to the three-fourths of the sampling frequency "fs", and so that the DA converter converts an inputted digital signal into an analog signal and outputs the analog signal, which is inverted or not in response to a value of the inputted digital signal and has an amplitude of substantially zero and a gradient of substantially zero at a timing k/(2fs), where "k" is any integer. Accordingly, each of the band-pass $\Delta\Sigma$ AD modulator and the digital radio receiver using the band-pass $\Delta\Sigma$ AD modulator according to the present invention has a configuration simpler than that of the prior art, can perform the AD-conversion at a higher precision than that of the prior art, and can directly convert the RF signal into the digital signal. In addition, it is possible to deal with a higher frequency input signal and realize operation with power consumption lower than that of the prior art.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A band-pass ΔΣ AD modulator comprising:
   an analog band-pass filter;
   an AD converter for performing AD conversion using a sampling clock having a predetermined sampling frequency "fs"; and
   a DA converter for performing DA conversion using the sampling clock having the sampling frequency "fs",
   wherein said band-pass ΔΣ AD modulator subtracts an analog signal from said DA converter from an inputted analog signal, outputs an analog signal having a subtraction result to said AD converter via said analog band-pass filter, outputs a digital signal from said AD converter to the DA converter, and outputs the digital signal as a digital signal subjected to a band-pass ΔΣ AD modulation processing,
   wherein the highest input frequency "fin" of the inputted analog signal is substantially set to three-fourths of the sampling frequency "fs", and
   wherein said DA converter converts an inputted digital signal into an analog signal, and outputs the analog signal, which is inverted or not in response to a value of the inputted digital signal and has an amplitude of substantially zero and a gradient of substantially zero at a timing k/(2fs), where "k" is any integer.

2. The band-pass ΔΣ AD modulator as claimed in claim 1, wherein, at a timing near the timing k/(2fs), the analog signal outputted from said DA converter changes so as to have a smaller gradient than gradients at the other timings other than timings near the timing k/(2fs), (the other timings excluding timings corresponding to the maximum point and the minimum point of the analog signal).

3. The band-pass ΔΣ AD modulator as claimed in claim 1, wherein said DA converter generates the analog signal by switching a predetermined alternating-current signal in response to the sampling clock, based on a value of the inputted digital signal, and by applying a predetermined bias voltage to a switched signal.

4. The band-pass ΔΣ AD modulator as claimed in claim 2, wherein said DA converter generates the analog signal by switching a predetermined alternating-current signal in response to the sampling clock, based on a value of the inputted digital signal, and by applying a predetermined bias voltage to a switched signal.

5. The band-pass ΔΣ AD modulator as claimed in claim 1, wherein said DA converter is a multi-bit DA converter, and said AD converter is a multi-bit AD converter.

6. The band-pass ΔΣ AD modulator as claimed in claim 2, wherein said DA converter is a multi-bit DA converter, and said AD converter is a multi-bit AD converter.

7. The band-pass ΔΣ AD modulator as claimed in claim 3, wherein said DA converter is a multi-bit DA converter, and said AD converter is a multi-bit AD converter.

8. The band-pass ΔΣ AD modulator as claimed in claim 4, wherein said DA converter is a multi-bit DA converter, and said AD converter is a multi-bit AD converter.

9. The band-pass ΔΣ AD modulator as claimed in claim 1, wherein said analog band-pass filter is a continuous-time analog band-pass filter.

10. The band-pass ΔΣ AD modulator as claimed in claim 2, wherein said analog band-pass filter is a continuous-time analog band-pass filter.

11. The band-pass ΔΣ AD modulator as claimed in claim 3, wherein said analog band-pass filter is a continuous-time analog band-pass filter.

12. The band-pass ΔΣ AD modulator as claimed in claim 4, wherein said analog band-pass filter is a continuous-time analog band-pass filter.

13. A digital radio receiver for band-pass-filtering a received signal using a band-pass filter, and then executing a band-pass ΔΣ AD modulation processing on a band-pass-filtered signal by a band-pass ΔΣ AD modulator,
    wherein said band-pass ΔΣ AD modulator comprises:
    an analog band-pass filter;
    an AD converter for performing AD conversion using a sampling clock having a predetermined sampling frequency "fs"; and
    a DA converter for performing DA conversion using the sampling clock having the sampling frequency "fs",
    wherein said band-pass ΔΣ AD modulator subtracts an analog signal from said DA converter from an inputted analog signal, outputs an analog signal having a subtraction result to said AD converter via said analog band-pass filter, outputs a digital signal from said AD converter to the DA converter, and outputs the digital signal as a digital signal subjected to a band-pass ΔΣ AD modulation processing,
    wherein the highest input frequency "fin" of the inputted analog signal is substantially set to three-fourths of the sampling frequency "fs", and
    wherein said DA converter converts an inputted digital signal into an analog signal, and outputs the analog signal, which is inverted or not in response to a value of the inputted digital signal and has an amplitude of substantially zero and a gradient of substantially zero at a timing k/(2fs), where "k" is any integer.

14. The digital radio receiver as claimed in claim 13, wherein, at a timing near the timing k/(2fs), the analog signal outputted from said DA converter changes so as to have a smaller gradient than gradients at the other timings other than timings near the timing k/(2fs), (the other timings excluding timings corresponding to the maximum point and the minimum point of the analog signal).

15. The digital radio receiver as claimed in claim 13, wherein said DA converter generates the analog signal by switching a predetermined alternating-current signal in response to the sampling clock, based on a value of the inputted digital signal, and by applying a predetermined bias voltage to a switched signal.

16. The digital radio receiver as claimed in claim 14, wherein said DA converter generates the analog signal by switching a predetermined alternating-current signal in response to the sampling clock, based on a value of the inputted digital signal, and by applying a predetermined bias voltage to a switched signal.

17. The digital radio receiver as claimed in claim 13, wherein said DA converter is a multi-bit DA converter, and said AD converter is a multi-bit AD converter.

18. The digital radio receiver as claimed in claim 14, wherein said DA converter is a multi-bit DA converter, and said AD converter is a multi-bit AD converter.

19. The digital radio receiver as claimed in claim 13, wherein said analog band-pass filter is a continuous-time analog band-pass filter.

20. The digital radio receiver as claimed in claim 14, wherein said analog band-pass filter is a continuous-time analog band-pass filter.

* * * * *